United States Patent
Gorobets et al.

(10) Patent No.: US 8,040,744 B2
(45) Date of Patent: Oct. 18, 2011

(54) SPARE BLOCK MANAGEMENT OF NON-VOLATILE MEMORIES

(75) Inventors: Sergey Anatolievich Gorobets, Edinburgh (GB); Alan David Bennett, Edinburgh (GB); Eugene Zilberman, Richmond Hill (CA)

(73) Assignee: SanDisk Technologies Inc., Plano, TX (US)

( * ) Notice: Subject to any disclaimer, the term of this patent is extended or adjusted under 35 U.S.C. 154(b) by 228 days.

(21) Appl. No.: 12/348,825

(22) Filed: Jan. 5, 2009

(65) Prior Publication Data

US 2010/0172179 A1 Jul. 8, 2010

(51) Int. Cl.
G11C 29/00 (2006.01)

(52) U.S. Cl. ............... 365/200; 365/201; 365/210.1; 365/185.09; 365/185.11; 711/103; 711/154; 711/156

(58) Field of Classification Search ............. 365/185.09, 365/185.11, 200, 201, 210.1; 711/103, 154, 711/156, 162, 170; 714/8
See application file for complete search history.

(56) References Cited

U.S. PATENT DOCUMENTS

| | | | |
|---|---|---|---|
| 4,622,656 A | 11/1986 | Kamiya et al. |
| 5,043,940 A | 8/1991 | Harari |
| 5,070,032 A | 12/1991 | Yuan et al. |
| 5,095,344 A | 3/1992 | Harari |
| 5,172,338 A | 12/1992 | Mehrotra |
| 5,268,870 A | 12/1993 | Harari |
| 5,291,440 A | 3/1994 | Koyama |
| 5,297,148 A | 3/1994 | Harari et al. |
| 5,313,421 A | 5/1994 | Guterman et al. |
| 5,315,541 A | 5/1994 | Harari et al. |
| 5,343,063 A | 8/1994 | Yuan et al. |
| 5,388,083 A | 2/1995 | Assar et al. |
| 5,438,573 A | 8/1995 | Mangan et al. |

(Continued)

FOREIGN PATENT DOCUMENTS

EP 0589597 3/1994

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Pho M Luu
*Assistant Examiner* — Thao Bui
(74) *Attorney, Agent, or Firm* — Davis Wright Tremaine LLP

(57) ABSTRACT

Techniques for the management of spare blocks in re-programmable non-volatile memory system, such as a flash EEPROM system, are presented. In one set of techniques, for a memory partitioned into two sections (for example a binary section and a multi-state section), where blocks of one section are more prone to error, spare blocks can be transferred from the more error prone partition to the less error prone partition. In another set of techniques for a memory partitioned into two sections, blocks which fail in the more error prone partition are transferred to serve as spare blocks in the other partition. In a complementary set of techniques, a 1-bit time stamp is maintained for free blocks to determine whether the block has been written recently. Other techniques allow for spare blocks to be managed by way of a logical to physical conversion table by assigning them logical addresses that exceed the logical address space of which a host is aware.

48 Claims, 20 Drawing Sheets

U.S. PATENT DOCUMENTS

| | | | |
|---|---|---|---|
| 5,479,638 | A | 12/1995 | Assar et al. |
| 5,485,595 | A | 1/1996 | Assar et al. |
| 5,532,962 | A | 7/1996 | Auclair et al. |
| 5,570,315 | A | 10/1996 | Tanaka et al. |
| 5,595,924 | A | 1/1997 | Yuan et al. |
| 5,619,448 | A | 4/1997 | Lin |
| 5,625,590 | A | 4/1997 | Choi et al. |
| 5,640,529 | A | 6/1997 | Hasbun |
| 5,661,053 | A | 8/1997 | Yuan |
| 5,671,388 | A | 9/1997 | Hasbun |
| 5,712,180 | A | 1/1998 | Guterman et al. |
| 5,751,634 | A | 5/1998 | Itoh |
| 5,761,128 | A * | 6/1998 | Watanabe ................ 365/189.15 |
| 5,768,192 | A | 6/1998 | Eitan |
| 5,774,397 | A | 6/1998 | Endoh et al. |
| 5,798,968 | A | 8/1998 | Lee et al. |
| 5,822,251 | A | 10/1998 | Bruce et al. |
| 5,835,935 | A | 11/1998 | Estakhri et al. |
| 5,841,699 | A | 11/1998 | Miyauchi |
| 5,851,881 | A | 12/1998 | Lin et al. |
| 5,860,124 | A | 1/1999 | Matthews et al. |
| 5,887,145 | A | 3/1999 | Harari et al. |
| 5,890,192 | A | 3/1999 | Lee et al. |
| 5,903,495 | A | 5/1999 | Takeuchi et al. |
| 5,909,449 | A | 6/1999 | So et al. |
| 5,928,370 | A | 7/1999 | Asnaashari |
| 5,930,167 | A | 7/1999 | Lee et al. |
| 5,930,815 | A | 7/1999 | Estakhri et al. |
| 5,936,971 | A | 8/1999 | Harari et al. |
| 5,956,743 | A | 9/1999 | Bruce et al. |
| 6,011,287 | A | 1/2000 | Itoh et al. |
| 6,028,794 | A | 2/2000 | Nakai et al. |
| 6,046,935 | A | 4/2000 | Takeuchi et al. |
| 6,076,137 | A | 6/2000 | Asnaashari |
| 6,081,447 | A | 6/2000 | Lofgren et al. |
| 6,103,573 | A | 8/2000 | Harari et al. |
| 6,128,695 | A | 10/2000 | Estakhri et al. |
| 6,134,143 | A | 10/2000 | Norman |
| 6,149,316 | A | 11/2000 | Harari et al. |
| 6,151,248 | A | 11/2000 | Harari et al. |
| 6,202,138 | B1 | 3/2001 | Estakhri et al. |
| 6,222,762 | B1 | 4/2001 | Guterman et al. |
| 6,230,233 | B1 | 5/2001 | Lofgren et al. |
| 6,281,075 | B1 | 8/2001 | Yuan et al. |
| 6,307,785 | B1 | 10/2001 | Takeuchi et al. |
| 6,335,878 | B1 | 1/2002 | Yamada et al. |
| 6,345,001 | B1 | 2/2002 | Mokhlesi |
| 6,373,746 | B1 | 4/2002 | Takeuchi et al. |
| 6,426,893 | B1 | 7/2002 | Conley et al. |
| 6,438,036 | B2 | 8/2002 | Seki et al. |
| 6,456,528 | B1 | 9/2002 | Chen |
| 6,512,263 | B1 | 1/2003 | Yuan et al. |
| 6,522,580 | B2 | 2/2003 | Chen et al. |
| 6,567,302 | B2 | 5/2003 | Lakhani |
| 6,567,307 | B1 | 5/2003 | Estakhri |
| 6,603,680 | B2 | 8/2003 | Kanamitsu et al. |
| 6,614,070 | B1 | 9/2003 | Hirose et al. |
| 6,684,289 | B1 | 1/2004 | Gonzalez et al. |
| 6,721,843 | B1 | 4/2004 | Estakhri |
| 6,763,424 | B2 | 7/2004 | Conley |
| 6,771,536 | B2 | 8/2004 | Li et al. |
| 6,781,877 | B2 | 8/2004 | Cernea et al. |
| 6,829,167 | B2 | 12/2004 | Tu et al. |
| 6,944,063 | B2 | 9/2005 | Chen et al. |
| 6,944,068 | B2 | 9/2005 | Quader et al. |
| 6,948,026 | B2 * | 9/2005 | Keays ........................... 711/103 |
| 7,012,835 | B2 | 3/2006 | Gonzalez et al. |
| 7,057,939 | B2 | 6/2006 | Li et al. |
| 7,085,161 | B2 | 8/2006 | Chen et al. |
| 7,120,729 | B2 | 10/2006 | Gonzalez et al. |
| 7,441,067 | B2 | 10/2008 | Gorobets et al. |
| 7,660,158 | B2 | 2/2010 | Aritome |
| 7,742,338 | B2 | 6/2010 | Santin et al. |
| 2002/0099904 | A1 | 7/2002 | Conley |
| 2002/0141237 | A1 | 10/2002 | Goda et al. |
| 2002/0172227 | A1 | 11/2002 | Varelas et al. |
| 2002/0184432 | A1 | 12/2002 | Ban |
| 2003/0002348 | A1 | 1/2003 | Chen et al. |
| 2003/0041210 | A1 | 2/2003 | Keays |
| 2003/0046487 | A1 | 3/2003 | Swaminathan |
| 2003/0109093 | A1 | 6/2003 | Harari et al. |
| 2003/0110343 | A1 * | 6/2003 | Hagiwara et al. ................ 711/5 |
| 2003/0123301 | A1 * | 7/2003 | Jang et al. ..................... 365/200 |
| 2003/0225961 | A1 | 12/2003 | Chow et al. |
| 2004/0047182 | A1 | 3/2004 | Cernea et al. |
| 2004/0080995 | A1 | 4/2004 | Mokhlesi et al. |
| 2004/0083335 | A1 | 4/2004 | Gonzalez et al. |
| 2004/0083405 | A1 | 4/2004 | Chang et al. |
| 2004/0177212 | A1 | 9/2004 | Chang et al. |
| 2004/0186946 | A1 | 9/2004 | Lee |
| 2004/0228197 | A1 | 11/2004 | Mokhlesi |
| 2005/0002232 | A1 | 1/2005 | Cernea et al. |
| 2005/0018482 | A1 | 1/2005 | Cemea et al. |
| 2005/0018527 | A1 | 1/2005 | Gorobets |
| 2005/0073884 | A1 | 4/2005 | Gonzalez et al. |
| 2005/0144365 | A1 | 6/2005 | Gorobets et al. |
| 2005/0144516 | A1 * | 6/2005 | Gonzalez et al. ................. 714/8 |
| 2005/0154818 | A1 | 7/2005 | Chen |
| 2005/0204187 | A1 | 9/2005 | Lee et al. |
| 2006/0053247 | A1 | 3/2006 | Cheung et al. |
| 2006/0161724 | A1 | 7/2006 | Bennett et al. |
| 2006/0161728 | A1 | 7/2006 | Bennett et al. |
| 2007/0061502 | A1 | 3/2007 | Lasser et al. |
| 2007/0101095 | A1 | 5/2007 | Gorobets |
| 2007/0266200 | A1 | 11/2007 | Gorobets et al. |
| 2007/0283081 | A1 | 12/2007 | Lasser |
| 2008/0104309 | A1 | 5/2008 | Cheon et al. |
| 2008/0112222 | A1 | 5/2008 | Shirakawa |
| 2008/0112238 | A1 | 5/2008 | Kim |
| 2008/0126683 | A1 | 5/2008 | Tsuji |
| 2008/0183949 | A1 | 7/2008 | Ly et al. |
| 2008/0198651 | A1 | 8/2008 | Kim |
| 2008/0244164 | A1 | 10/2008 | Chang et al. |
| 2009/0089491 | A1 | 4/2009 | Hatanaka et al. |
| 2009/0187798 | A1 * | 7/2009 | Kim ............................ 714/710 |
| 2010/0172180 | A1 | 7/2010 | Paley et al. |
| 2010/0174845 | A1 | 7/2010 | Gorobets et al. |
| 2010/0174846 | A1 | 7/2010 | Paley et al. |
| 2010/0174847 | A1 | 7/2010 | Paley et al. |
| 2010/0174869 | A1 | 7/2010 | Gorobets et al. |

FOREIGN PATENT DOCUMENTS

| | | |
|---|---|---|
| WO | 98/24028 A1 | 6/1998 |
| WO | WO 00/49488 A1 | 8/2000 |
| WO | 02/49039 A2 | 6/2002 |
| WO | 02/058074 A2 | 7/2002 |
| WO | WO 03/027828 A1 | 4/2003 |
| WO | WO 2004/040459 A | 5/2004 |
| WO | WO 2004/040578 A | 5/2004 |
| WO | WO 2004/040585 A | 5/2004 |
| WO | WO 2006/065668 A2 | 6/2006 |
| WO | WO 2007/141783 A1 | 12/2007 |

OTHER PUBLICATIONS

EPO/ISA, "Invitation to Pay Additional Fees," corresponding International Patent Application No. PCT/US2010/020014, mailed on Mar. 26, 2010, 6 pages.

Notification of Transmittal of the International Search Report and the Written Opinion of the International Searching Authority, or the Declaration, corresponding International Patent Application No. PCT/US2010/020014, mailed on Jun. 28, 2010, 18 pages.

"3.1: Objects, values and types." Python Library Reference. 2004, 2 pages. http://web.archive.org/web/20040823015823/docs.python.org/ref/about.html.

Chang, "An Adaptive Striping Architecture for Flash Memory Storage Systems of Embedded Systems." Proceedings of the Eighth IEEE Real-Time and Embedded Technology and Applications Symposium, 2002, pp. 1-10.

Chiang, "Managing Flash Memory in Personal Communication Devices." IEEE, 1997, pp. 177-182.

Chiang, "Cleaning Policies in Mobile Computers using Flash Memory," Journal of Systems and Software. Elsevier Science, 1999, pp. 213-231.

Kalinsky, David, "Introduction to Priority Inversions." Embedded Systems Programming. Apr. 2002, pp. 55-56. http://www.netrino.com/Publications/Glossary/Priority/Inversion.html.

Park, "Cost-Efficient Memory Architecture Design of NAND Flash Memory Embedded Systems." Proceedings of the 21$^{st}$ International Conference on Computer Design, 2003, pp. 1-6.

Kamiya et al., "EPROM Cell with High Gate Injection Efficiency," IEDM Technical Digest, Dec. 1982, pp. 741-744.

Brown et al., "Nonvolatile Semiconductor Memory Technology," IEEE Press, Section 1.2, 1998, pp. 9-25.

Chan et al., "A True Single-Transistor Oxide-Nitride-Oxide EEPROM Device," IEEE Electron Device Letters, vol. EDL-8, No. 3, Mar. 1987, pp. 93-95.

Nozaki et al., "A 1-Mb EEPROM With MONOS Memory Cell for Semiconductor Disk Application," IEEE Journal of Solid-State Circuits, vol. 26, No. 4, Apr. 1991, pp. 497-501.

* cited by examiner

Programming into Four States Represented by a 2-bit Code

SPARE BLOCK MANAGEMENT OF NON-VOLATILE MEMORIES

CROSS-REFERENCE TO RELATED PATENT APPLICATIONS

This application is also related to United States patent applications: "WEAR LEVELING FOR NON-VOLATILE MEMORIES: MAINTENANCE OF EXPERIENCE COUNT AND PASSIVE TECHNIQUES", by Gorobets, Sergey A. et al.; "NONVOLATILE MEMORY AND METHOD WITH WRITE CACHE PARTITIONING", by Paley, Alexander et al.; "NONVOLATILE MEMORY WITH WRITE CACHE HAVING FLUSH/EVICTION METHODS", by Paley, Alexander et al.; "NONVOLATILE MEMORY WITH WRITE CACHE PARTITION MANAGEMENT METHODS", by Paley, Alexander et al.; and MAPPING ADDRESS TABLE MAINTENANCE IN A MEMORY DEVICE, by Gorobets, Sergey A. et al.; and Provisional application "NONVOLATILE MEMORY AND METHOD WITH IMPROVED BLOCK MANAGEMENT SYSTEM", by Gorobets, Sergey A. et al., all being filed concurrently herewith.

Any and all patents, patent applications, articles, and other publications and documents referenced herein are hereby incorporated herein by those references in their entirety for all purposes. To the extent of any inconsistency or conflict in the definition or use of terms between the present provisional application and any incorporated patents, patent applications, articles or other publications and documents, those of the present application shall prevail.

FIELD OF THE INVENTION

This invention relates generally to the operation of non-volatile flash memory systems, and, more specifically, to techniques of managing usage of blocks or other portions of the memory, particularly in memory systems having large memory cell blocks.

BACKGROUND

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is rewrite the update data in the same physical memory location. That is, the logical to physical address mapping is unchanged. However, this will mean the entire erase block contain that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Data communicated through external interfaces of host systems, memory systems and other electronic systems are addressed and mapped into the physical locations of a flash memory system. Typically, addresses of data files generated or received by the system are mapped into distinct ranges of a continuous logical address space established for the system in terms of logical blocks of data (hereinafter the "LBA interface"). The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive.

Flash memory systems are most commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In current commercial flash memory systems, the size of the erase unit has been increased to a block of enough memory cells to store multiple sectors of data. Indeed, many pages of data are stored in one block, and a page may store multiple sectors of data. Further, two or more blocks are often operated together as metablocks, and the pages of such blocks logically linked together as metapages. A page or metapage of data are written and read together, which can include many sectors of data, thus increasing the parallelism of the operation. Along with such large capacity operating units the challenge is to operate them efficiently.

For ease of explanation, unless otherwise specified, it is intended that the term "block" as used herein refer to either the block unit of erase or a multiple block "metablock," depending upon whether metablocks are being used in a specific system. Similarly, reference to a "page" herein may refer to a unit of programming within a single block or a "metapage" within a metablock, depending upon the system configuration.

When the currently prevalent LBA interface to the memory system is used, files generated by a host to which the memory is connected are assigned unique addresses within the logical address space of the interface. The memory system then commonly maps data between the logical address space and pages of the physical blocks of memory. The memory system keeps track of how the logical address space is mapped into the physical memory but the host is unaware of this. The host keeps track of the addresses of its data files within the logical address space but the memory system operates with little or no knowledge of this mapping.

Another problem with managing flash memory system has to do with system control and directory data. The data is produced and accessed during the course of various memory operations. Thus, its efficient handling and ready access will directly impact performance. It would be desirable to maintain this type of data in flash memory because flash memory is meant for storage and is nonvolatile. However, with an intervening file management system between the controller and the flash memory, the data can not be accessed as directly. Also, system control and directory data tends to be active and fragmented, which is not conducive to storing in a system with large size block erase. Conventionally, this type of data is set up in the controller RAM, thereby allowing direct access by the controller. After the memory device is powered up, a process of initialization enables the flash memory to be scanned in order to compile the necessary system control and directory information to be placed in the controller RAM. This process takes time and requires controller RAM capacity, all the more so with ever increasing flash memory capacity.

U.S. Pat. No. 6,567,307 discloses a method of dealing with sector updates among large erase block including recording the update data in multiple erase blocks acting as scratch pad and eventually consolidating the valid sectors among the various blocks and rewriting the sectors after rearranging them in logically sequential order. In this way, a block needs not be erased and rewritten at every slightest update.

WO 03/027828 and WO 00/49488 both disclose a memory system dealing with updates among large erase block including partitioning the logical sector addresses in zones. A small zone of logical address range is reserved for active system control data separate from another zone for user data. In this way, manipulation of the system control data in its own zone will not interact with the associated user data in another zone. Updates are at the logical sector level and a write pointer points to the corresponding physical sectors in a block to be written. The mapping information is buffered in RAM and eventually stored in a sector allocation table in the main memory. The latest version of a logical sector will obsolete all previous versions among existing blocks, which become partially obsolete. Garbage collection is performed to keep partially obsolete blocks to an acceptable number.

Prior art systems tend to have the update data distributed over many blocks or the update data may render many existing blocks partially obsolete. The result often is a large amount of garbage collection necessary for the partially obsolete blocks, which is inefficient and causes premature aging of the memory. Also, there is no systematic and efficient way of dealing with sequential update as compared to non-sequential update.

Flash memory with a block management system employing a mixture of sequential and chaotic update blocks is disclosed in United States Patent Publication No. US-2005-0144365-A1 dated Jun. 30, 2005, the entire disclosure of which is incorporated herein by reference.

SUMMARY OF THE INVENTION

In a first set of aspects, a non-volatile memory system includes a non-volatile memory circuit having a plurality of erase blocks each formed of a plurality of non-volatile memory cells, the blocks being operable in a first and a second mode, the first operating mode being of higher endurance than the second operating mode. The memory system also includes a controller circuit connected to the memory circuit for controlling the transfer of data between the memory circuit and a host to which the memory system is attached and the management of data stored on the memory circuit. The memory is partitioned into a first section of blocks operated according to the first mode and a second section of blocks operated according to the second mode, where the second section initially includes one or more spare blocks allocated to be used to replace a defective block in the second section. The controller can reassign spare blocks from the second section to be spare blocks for the first section.

In a second set of embodiments, a non-volatile memory system includes a non-volatile memory circuit having a plurality of erase blocks each formed of a plurality of non-volatile memory cells, the blocks being operable in a first and a second mode, the first operating mode being of higher endurance than the second operating mode. The memory system also includes a controller circuit connected to the memory circuit for controlling the transfer of data between the memory circuit and a host to which the memory system is attached and the management of data stored on the memory circuit. The memory is partitioned into a first section of blocks operated according to the first mode and a second section of blocks operated according to a second mode. In response to determining that a block from the second partition is defective when operated in the second mode, the controller can reassign the determined block to the first partition to be a spare block usable to replace a defective block in the first section and operated according to the first mode.

In further aspects, a non-volatile memory system includes a non-volatile memory circuit having a plurality of erase blocks each formed of a plurality of non-volatile memory cells, the memory blocks including a data storage portion and an overhead storing portion, the overhead including a one bit time stamp. The memory system also includes a controller circuit connected to the memory circuit to control the transfer of data between the memory circuit and a host to which the memory system is attached and to manage data stored on the memory circuit, where the control circuit maintains a control structure for unassigned blocks that includes a one bit time stamp for each unassigned block. The value of the time stamp's bit in the overhead of a given block is toggled in response to the block undergoing an erase operation. The value of the time stamp in the control structure for the unassigned blocks is set to the value of time stamp in the overhead of the corresponding block when the corresponding block is entered in the control structure for unassigned blocks. During an initialization process, the controller performs a comparison of the values of said time stamp in the overhead of the unassigned blocks with the value of the corresponding time stamp in the control structure for the respective unassigned blocks.

Additional aspects present a non-volatile memory system having a non-volatile memory circuit having a plurality of erase blocks each formed of a plurality of non-volatile memory cells and a controller circuit connected to the memory circuit to control the transfer of data between the memory circuit and a host to which the memory system is attached and to manage data stored on the memory circuit. The plurality of blocks include a first plurality of blocks used to store host supplied data identified by a logical address and to store system data and one or more spare blocks to compensate for failed blocks of the first plurality of blocks. The control circuit maintains a logical to physical addresses conversion table holding entries for blocks containing host supplied data and entries for spare blocks. The table entries assign the blocks containing host supplied data the corresponding logical addresses by which the host identifies the data and assign spare blocks logical addresses exceeding the logical address space of which the host is aware.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DESCRIPTION OF EXEMPLARY EMBODIMENTS MEMORY SYSTEM

Figure 1:
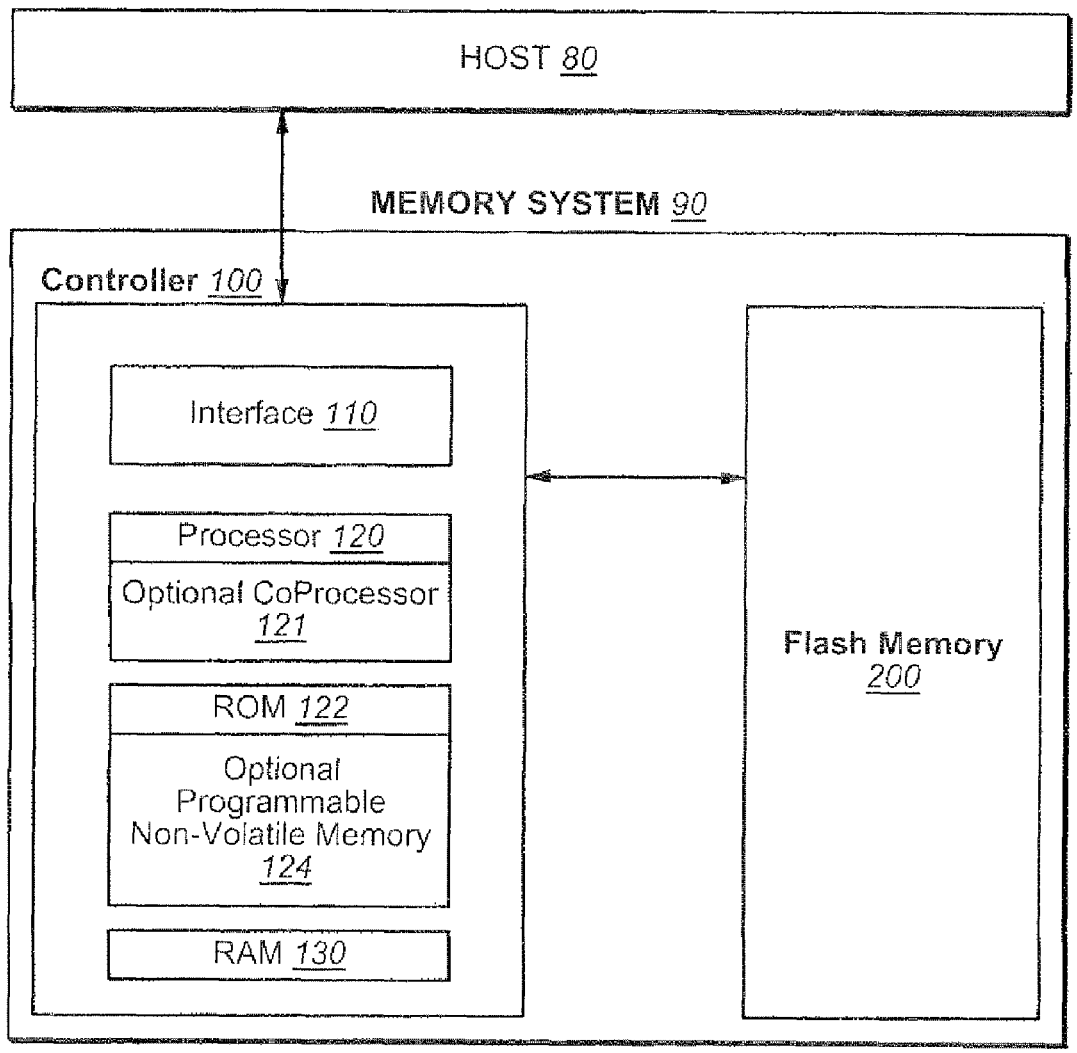
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
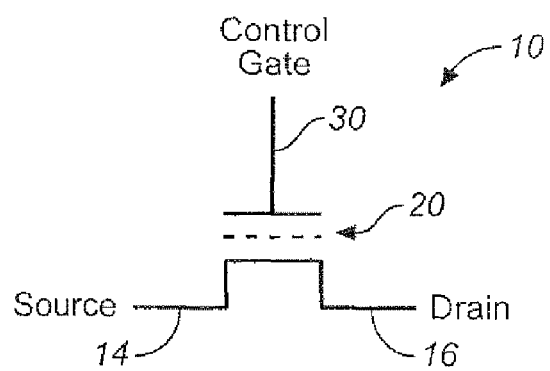
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
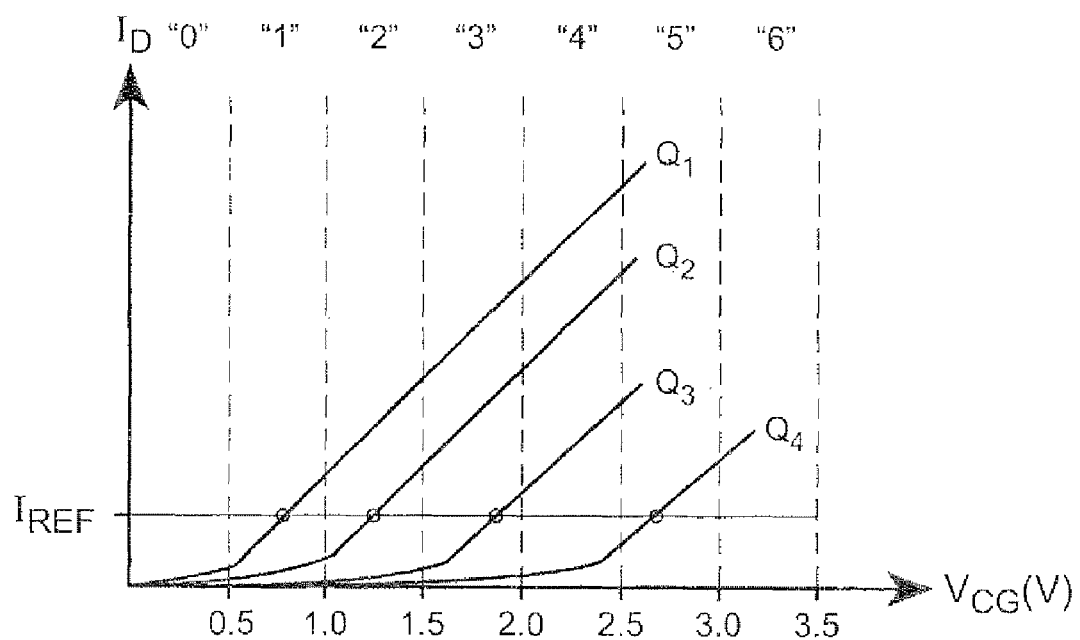
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current ID and the control gate voltage $V_{CG}$ for four different charges Q1-Q4 that the floating gate may be selectively storing at any one time. The four solid ID versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "b 5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
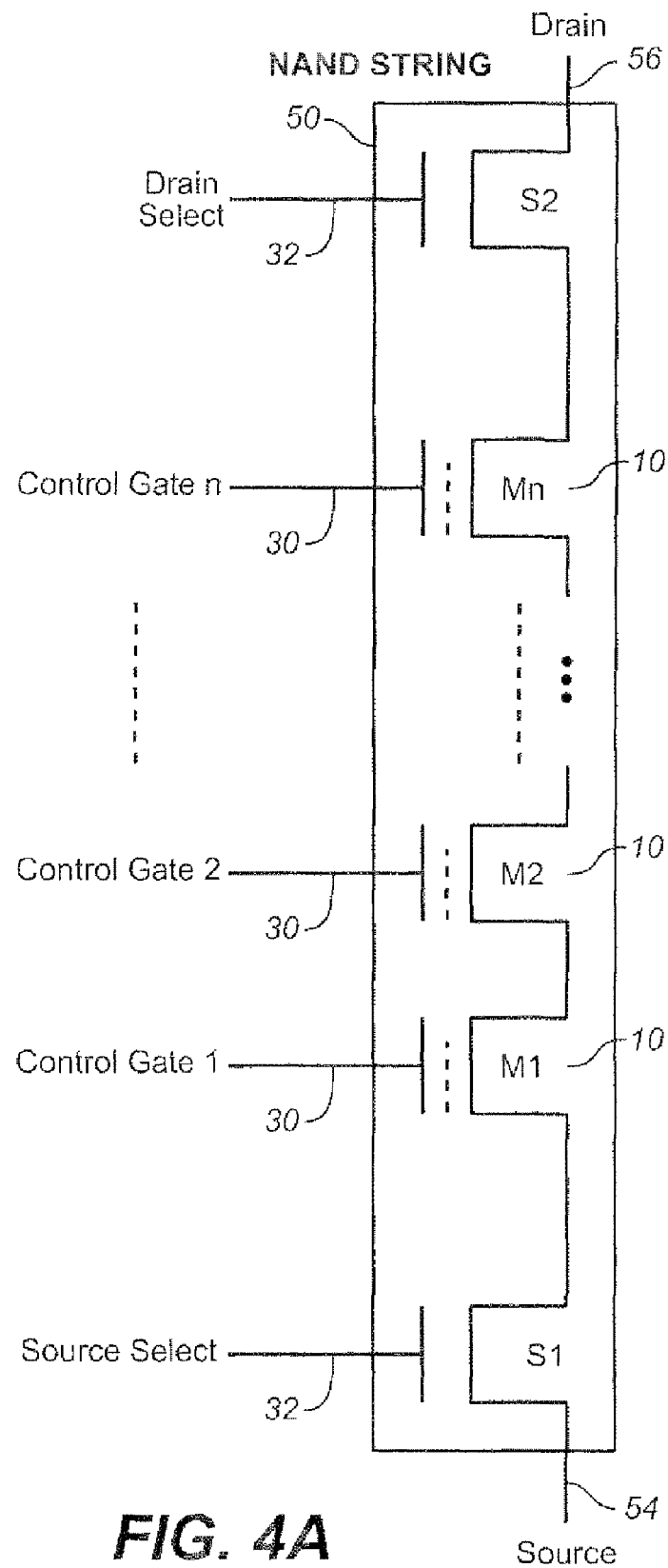
FIG. 4A illustrates schematically a string of memory cells organized into an NAND string.

FIG. 4A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
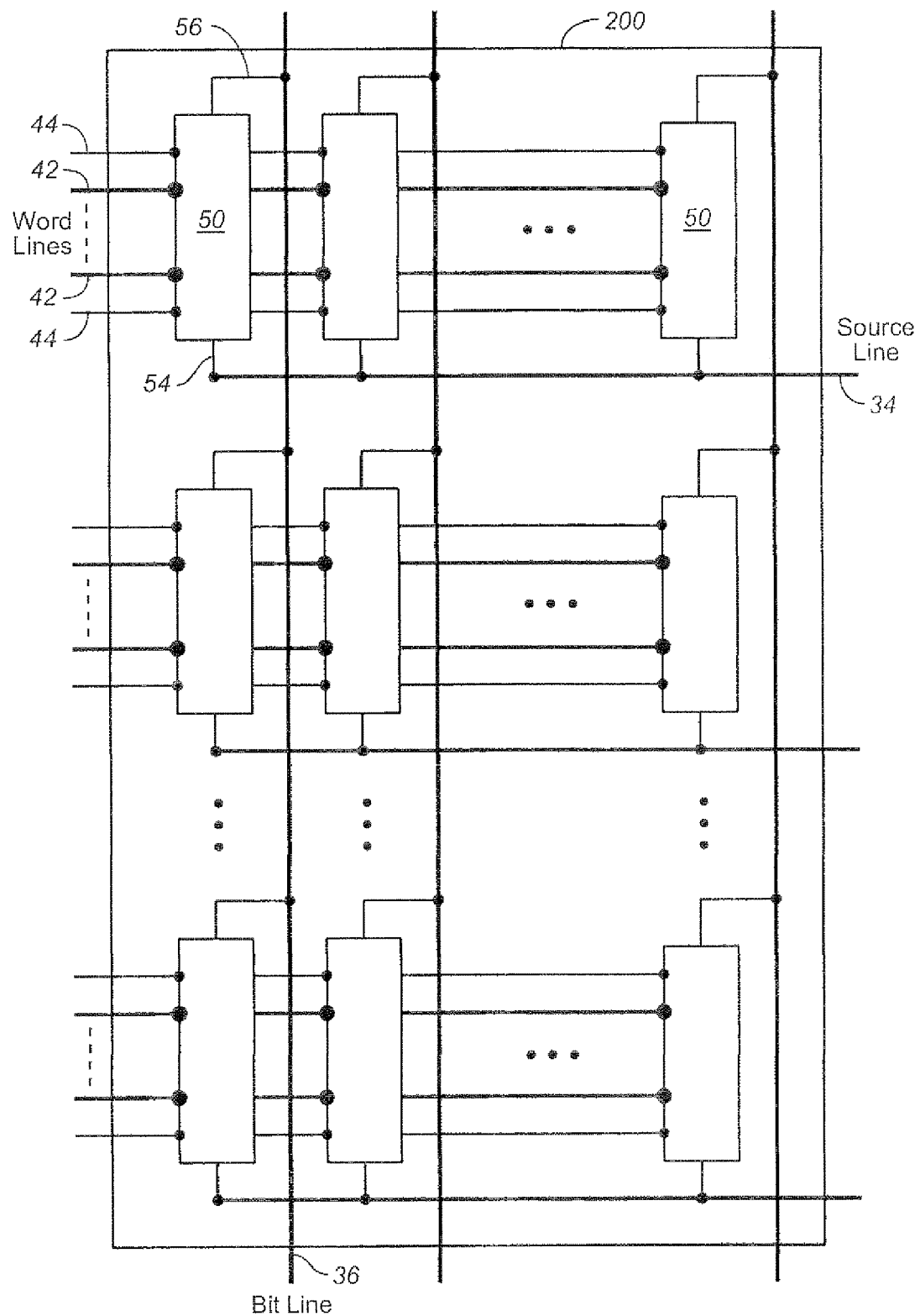
FIG. 4B illustrates an example of an NAND array 210 of memory cells, constituted from NAND strings 50 such as that shown in FIG. 4A.

FIG. 4B illustrates an example of an NAND array 210 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
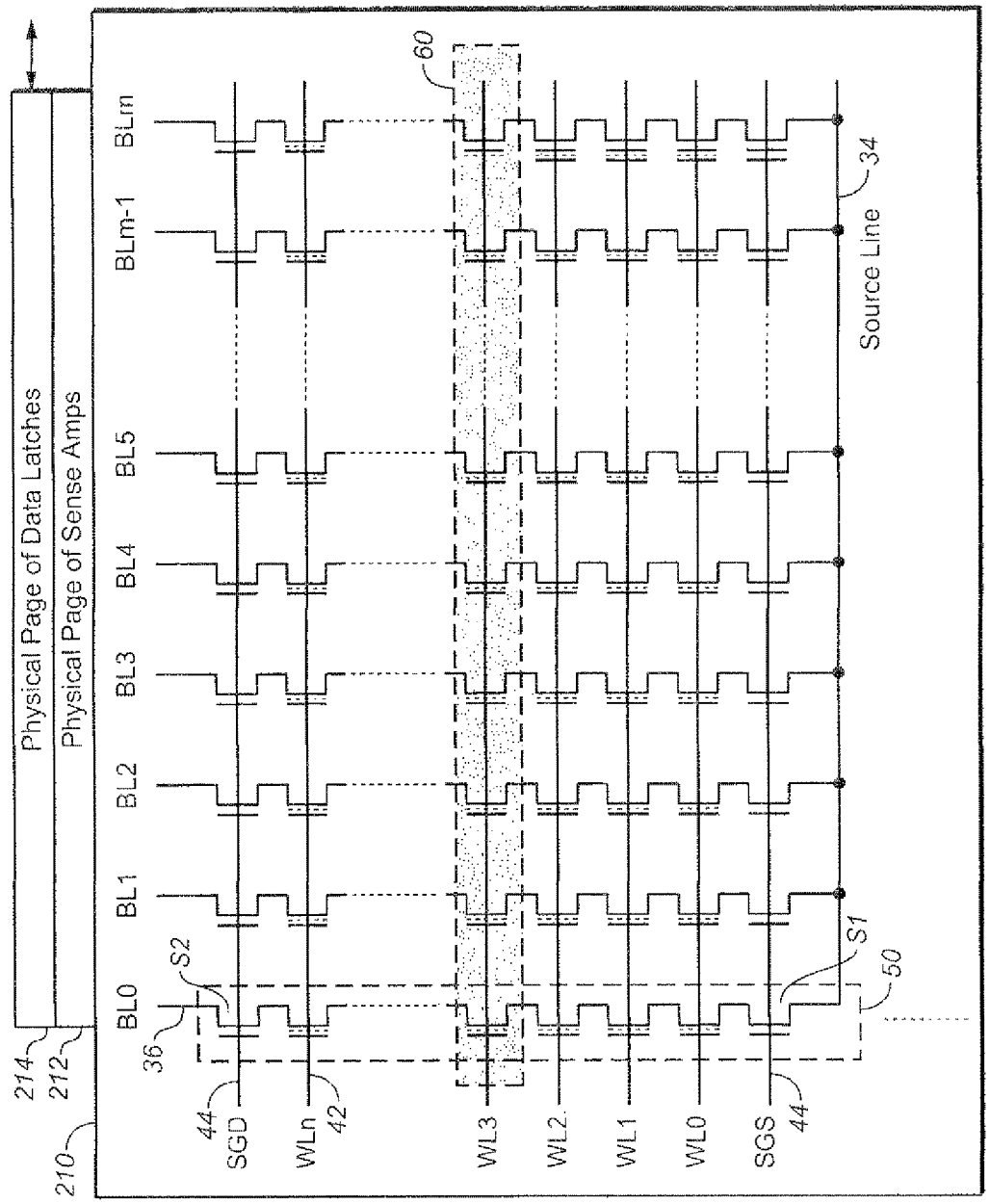
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and of type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell of even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-Level Cell ("MLC") Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-Bit Full-Sequence MLC Programming

Figure 6:
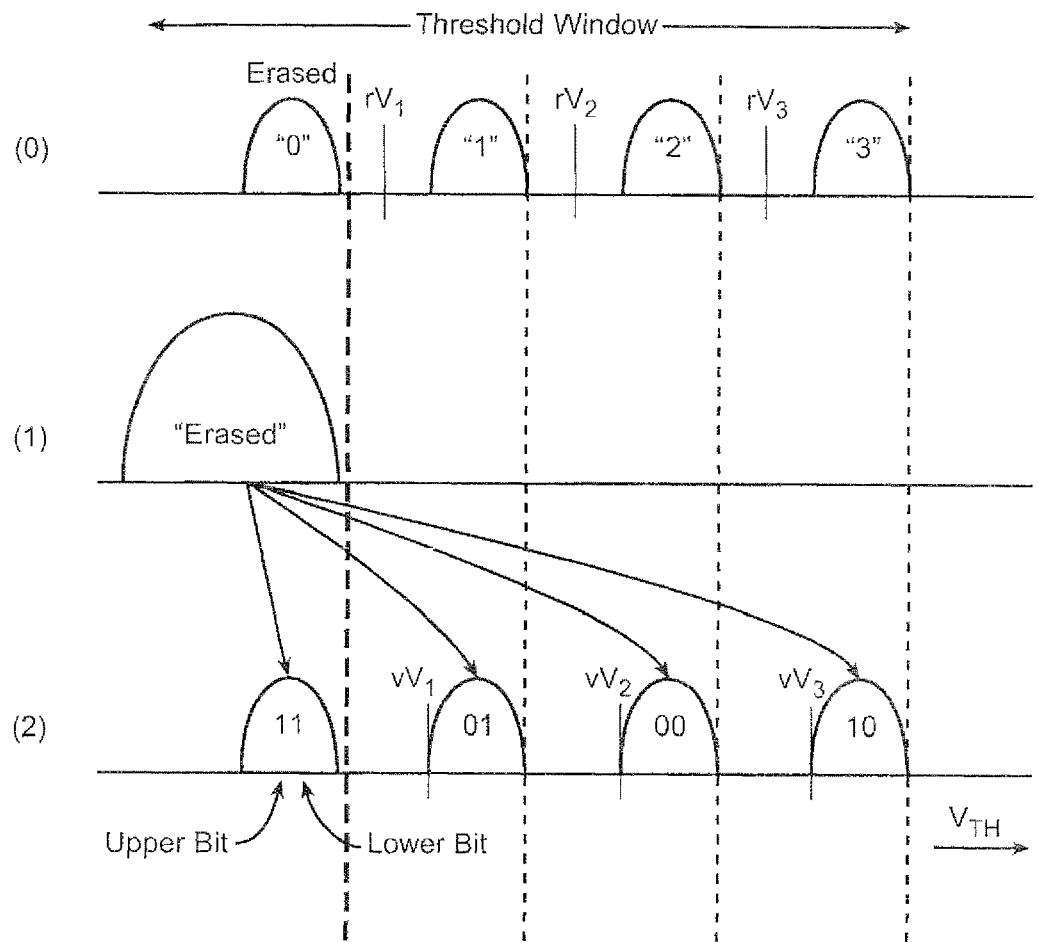
FIGS. 6(0)-6(2) illustrate an example of programming a population of 4-state memory cells.

FIG. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1" "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
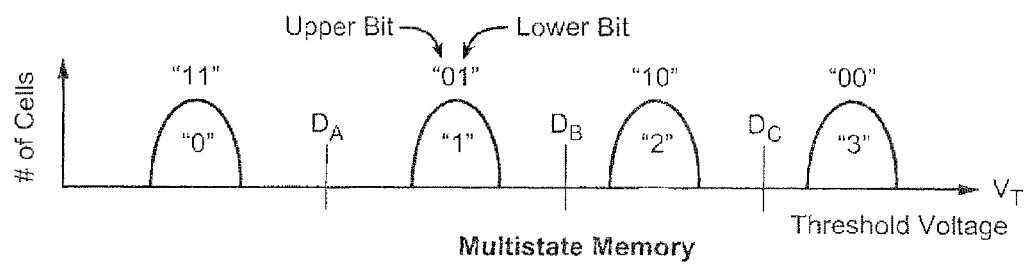
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. patent application Ser. No. 10/830,824 filed Apr. 24, 2004 by Li et al., entitled "NON-VOLATILE MEMORY AND CONTROL WITH IMPROVED PARTIAL PAGE PROGRAM CAPABILITY".

Figure 7B:
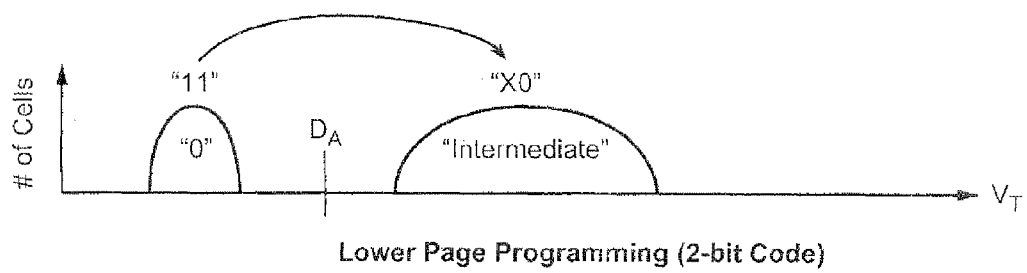

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
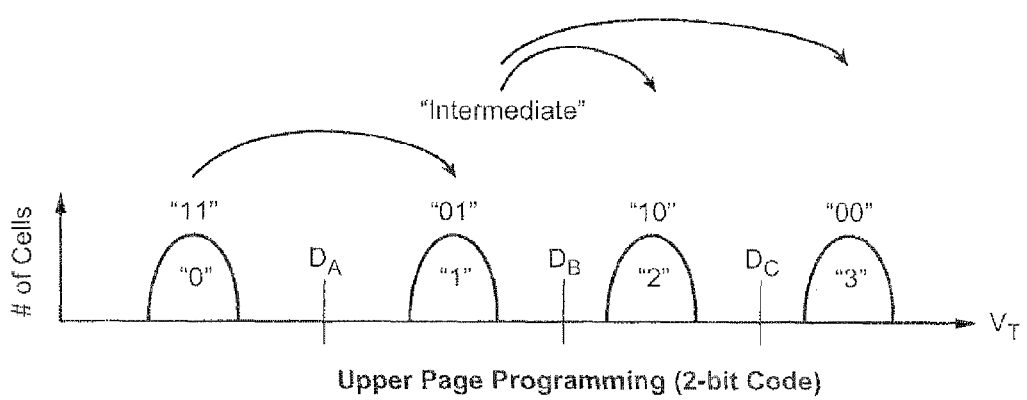

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
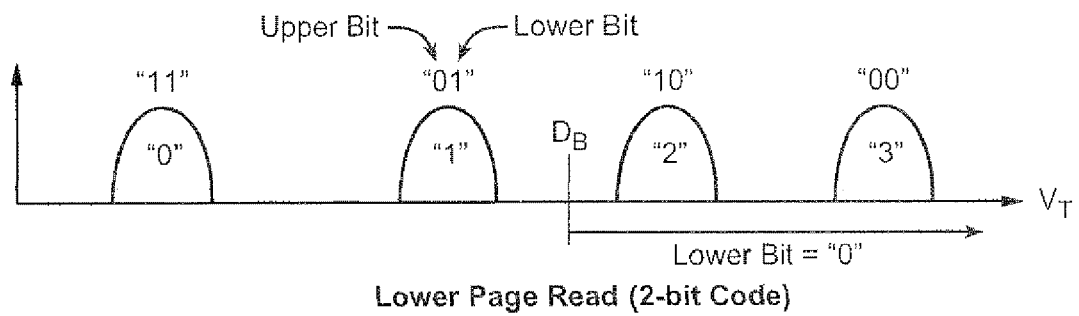

FIG. 7D illustrates the read operation that is required to discern the lower bit of the 4-state memory encoded with the 2-bit code. A readB operation is first performed to determine if the LM flag can be read. If so, the upper page has been programmed and the reacid operation will yield the lower page data correctly. On the other hand, if the upper page has not yet been programmed, the lower page data will be read by a readA operation.

Figure 7E:
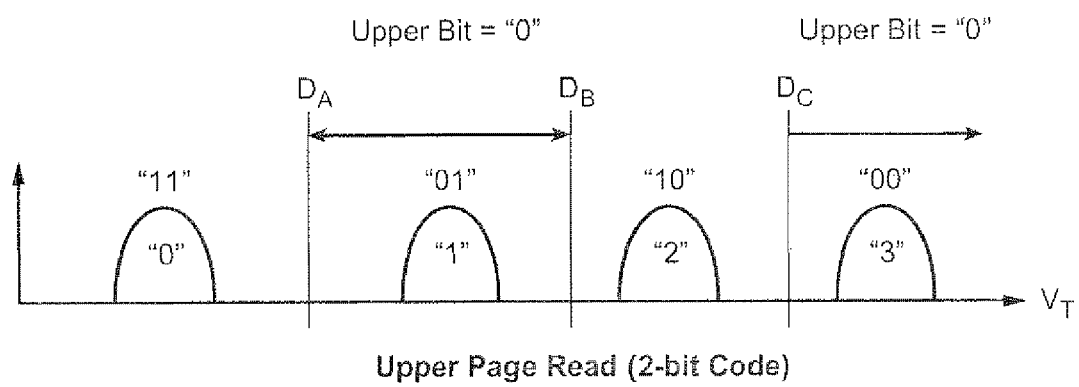

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution and for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charges is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. How it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique will be compromised by partial-page programming. A page is a group of memory cells, typically along a row or word line, that is programmed together as a unit. It is possible to program non overlapping portions of a page individually over multiple programming passes. However, owning to not all the cells of the page are programmed in a final pass together, it could create large difference in charges programmed among the cells after the page is done. Thus partial-page programming would result in more program disturb and would require a larger margin for sensing accuracy.

In the case the memory is configured as binary memory, the margin of operation is wider than that of MLC. In the preferred embodiment, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

Figure 8:
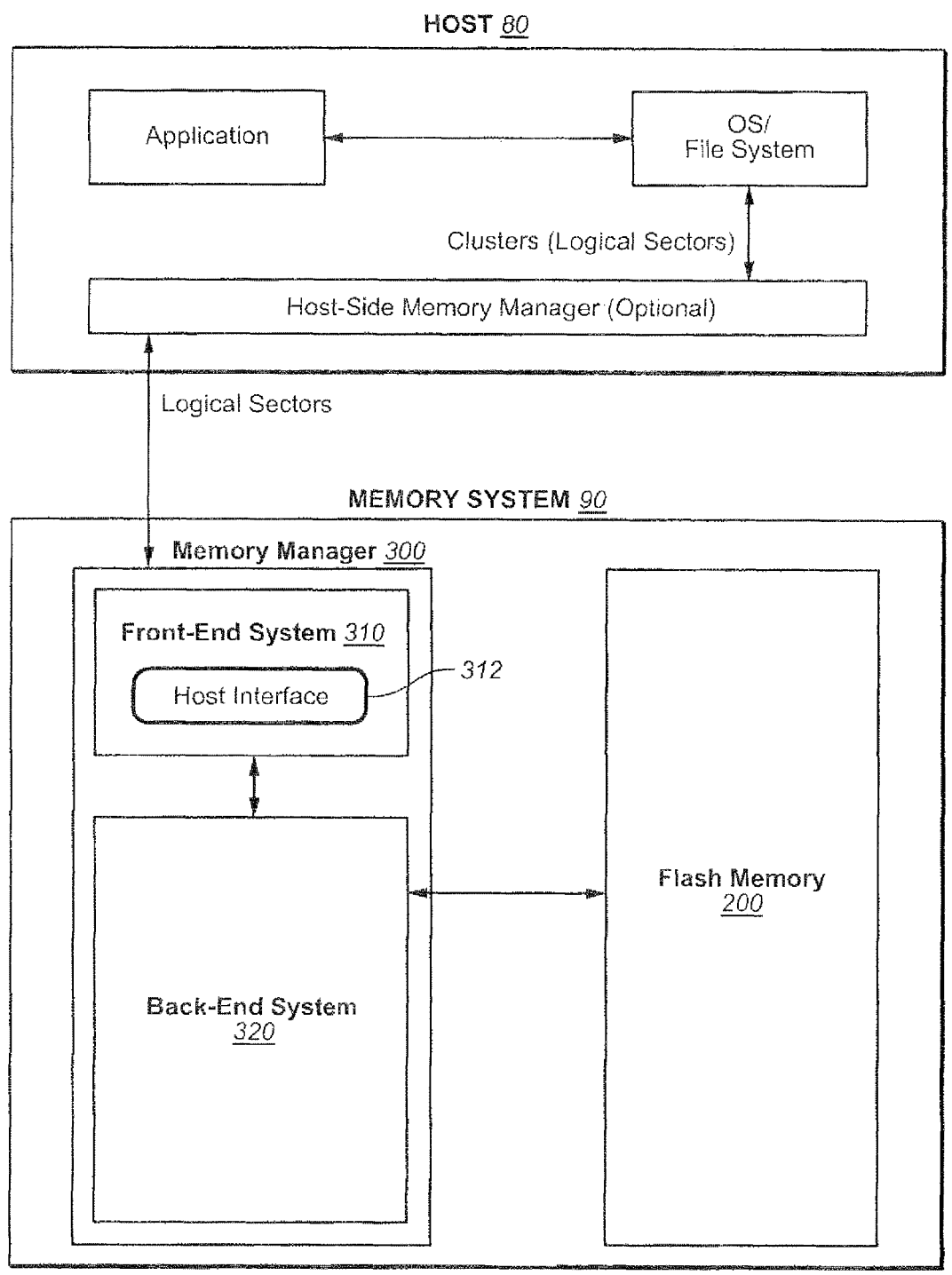
FIG. 8 illustrates the memory being managed by a memory manager with is a software component that resides in the controller.

FIG. 8 illustrates the memory being managed by a memory manager with is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Figure 9:
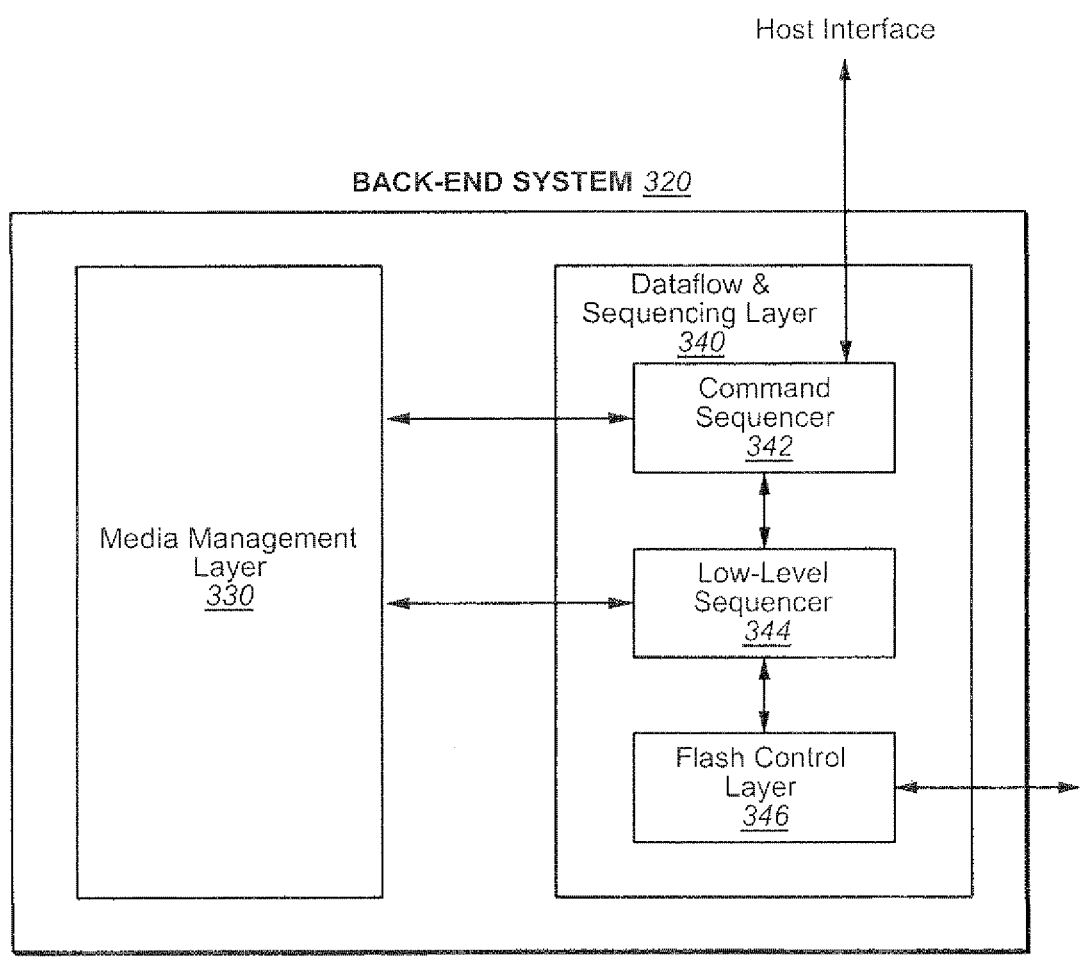
FIG. 9 illustrates the software modules of the back-end system.

FIG. 9 illustrates the software modules of the back-end system. The Back-End System mainly comprises two functional modules: a Media Management Layer 330 and a Dataflow and Sequencing Layer 340.

The media management layer 330 is responsible for the organization of logical data storage within a flash memory meta-block structure. More details will be provided later in the section on "Media management Layer".

The dataflow and sequencing layer 340 is responsible for the sequencing and transfer of sectors of data between a front-end system and a flash memory. This layer includes a command sequencer 342, a low-level sequencer 344 and a flash Control layer 346. More details will be provided later in the section on "Low Level System Spec".

The memory manager 300 is preferably implemented in the controller 100. It translates logical addresses received from the host into physical addresses within the memory array, where the data are actually stored, and then keeps track of these address translations.

Figure 10A:
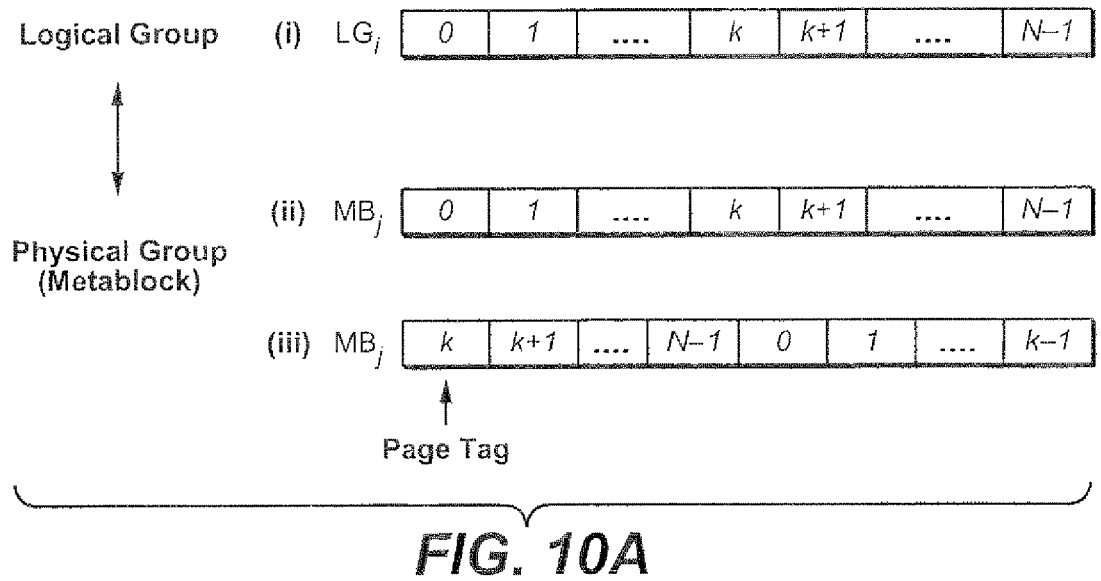
FIGS. 10A(i)-10A(iii) illustrate schematically the mapping between a logical group and a metablock.

FIGS. 10A(i)-10A(iii) illustrate schematically the mapping between a logical group and a metablock. The metablock of the physical memory has N physical sectors for storing N logical sectors of data of a logical group. FIG. 10A(i) shows the data from a logical group $LG_i$, where the logical sectors are in contiguous logical order 0, 1, ..., N-1. FIG. 10A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 10A(iii), the metablock stores in its first location beginning with the data of logical sector k. When the last logical sector N-1 is reached, it wraps around to sector 0 and finally storing data associated with logical sector k-1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 10B:
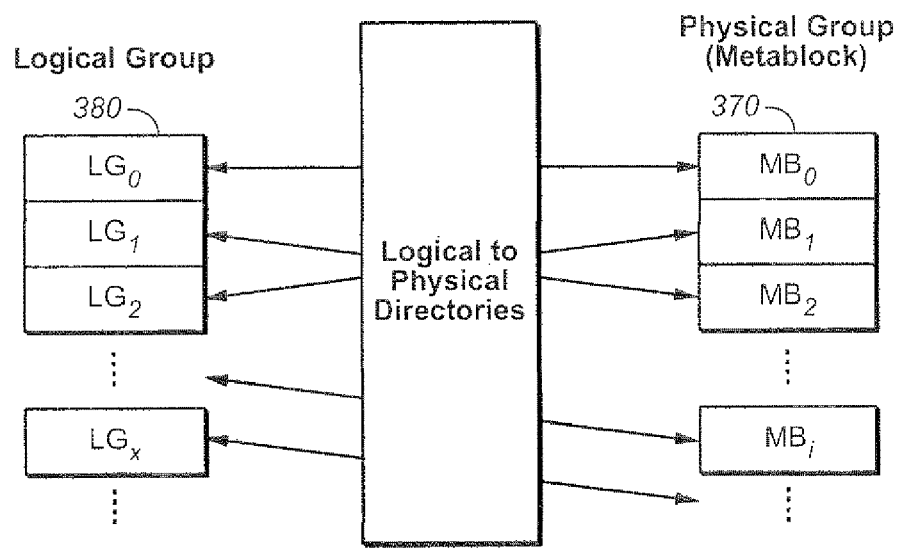
FIG. 10B illustrates schematically the mapping between logical groups and metablocks.

FIG. 10B illustrates schematically the mapping between logical groups and metablocks. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later.

System Abstraction Model

Figure 11:
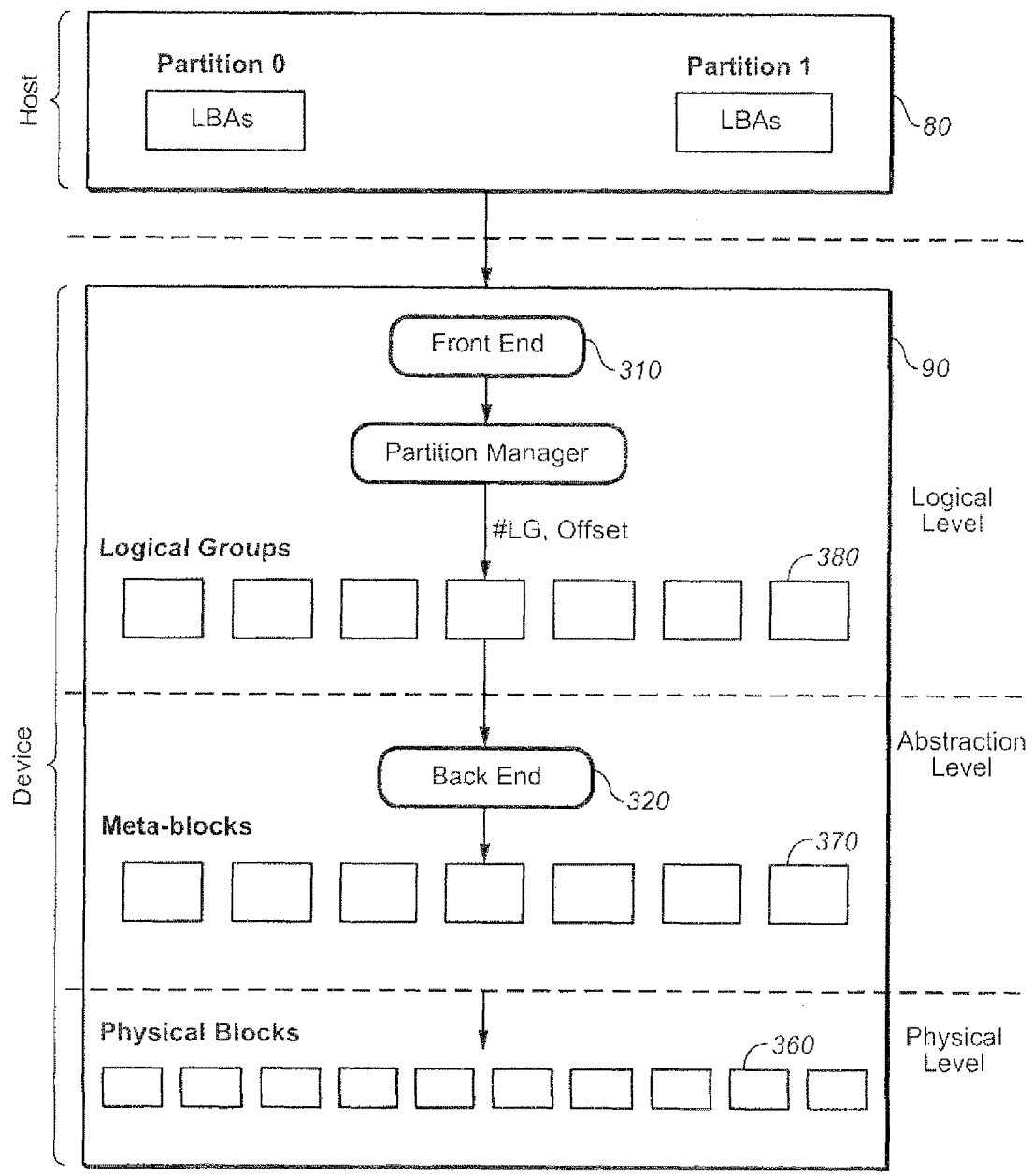
FIG. 11 illustrates the organizational system abstract levels showing the relation between host's logical address LBA, their grouping into logical groups and mapping to groupings of physical blocks (i.e., metablocks)

FIG. 11 illustrates the organizational system abstract levels showing the relation between host's logical address LBA, their grouping into logical groups and mapping to groupings of physical blocks (i.e., metablocks). There are three abstraction levels distributed among the front-end 310 and back-end 320 of the memory manager 300 (see also FIG. 8).

At the front end 310, in a logical level organization, a partition manager groups logical units (LBAs) from the host into logical groups. Each logical group 380 will be stored in a metablock 370 of the memory.

At the back end 320, in a physical level, the memory is organized into physical blocks, each physical block 360 being a minimum physical unit of erase. However, to improve performance, greater parallelism is achieved in an abstraction level where an aggregate of blocks (metablock) are logically grouped to be erased together.

Figure 12:
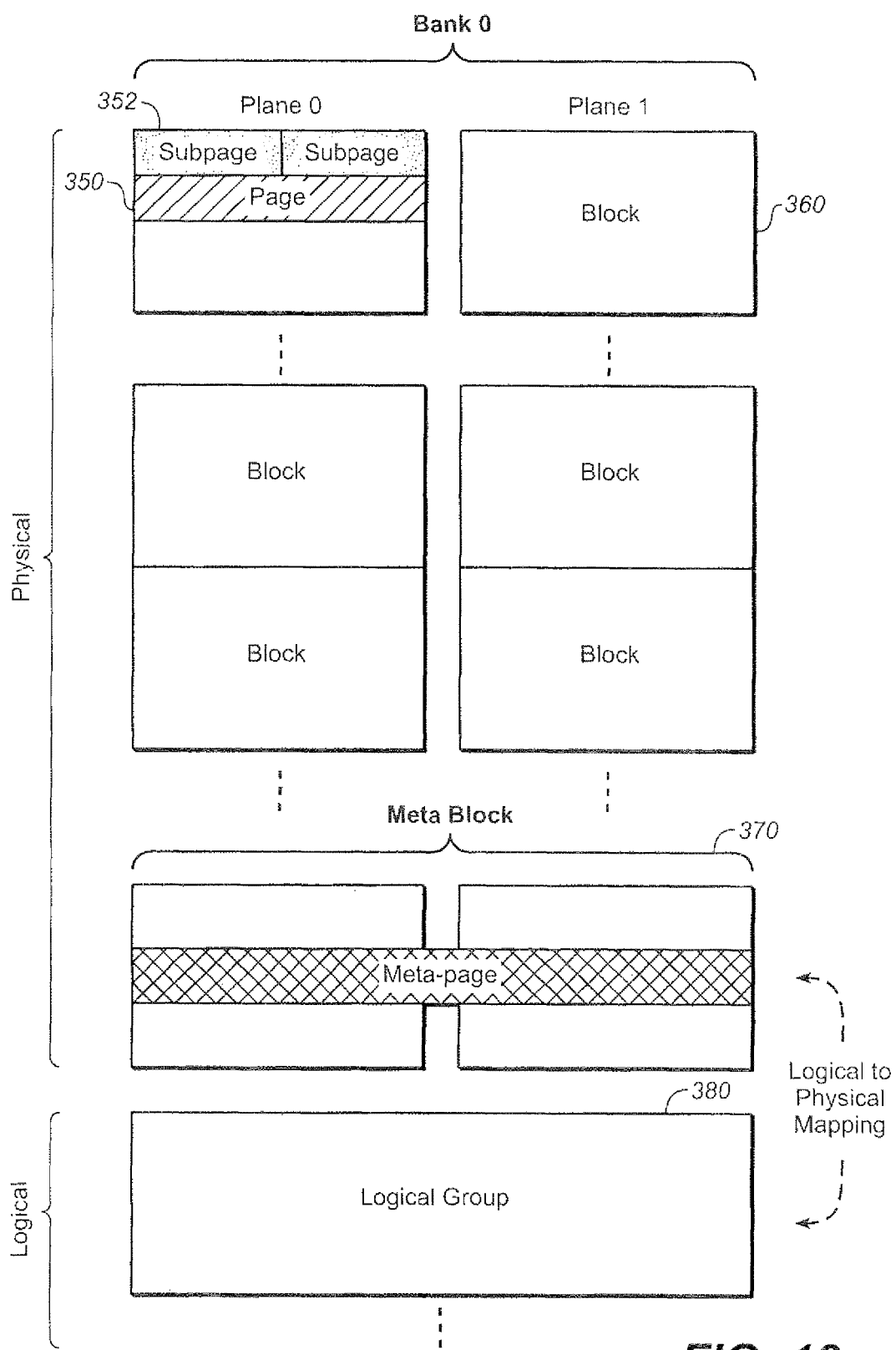
FIG. 12 illustrates the physical and logical memory architecture.

FIG. 12 illustrates the physical and logical memory architecture. Physically, the memory is organized into blocks which are the minimum unit of erase physically. Typically, a memory plane is an array of memory cells served by a page of sensing circuits. The plane contains a plurality of blocks. Each block 360 contains multiple physical pages. For binary memory, each physical page 350 stores one data page. For MLC, each physical page stores more than one data page. The physical page 350 is further partitioned into subpages. For binary memory, each subpage 352 stores one data ECC page. A metablock 370 is a logical grouping of erase blocks across multiple planes for the memory manager to erase as a unit. Similarly a metapage 372 is a logical grouping of pages across multiple planes for the memory manager to program or read as a unit. The logical group is a grouping of host logical units that are to be store in a metablock.

Figure 13:
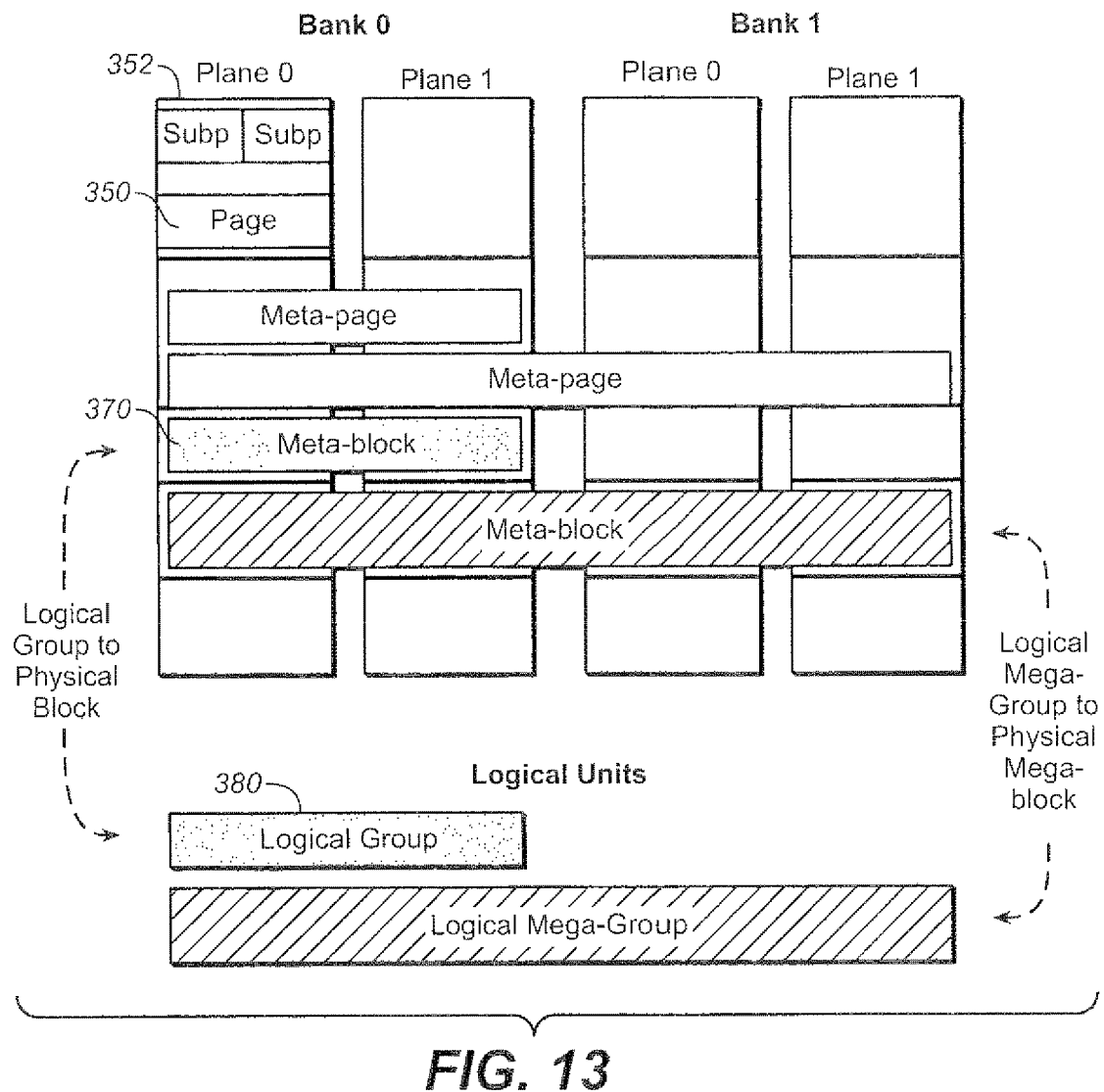
FIG. 13 illustrates the physical and logical memory architecture across multiple banks.

FIG. 13 illustrates the physical and logical memory architecture across multiple banks. Even more parallelism is achieved when the various entities are logical grouped across banks. The aggregated entities are each label with the prefix "mega". In particular, the various entities are defined below.

Figure 14A:
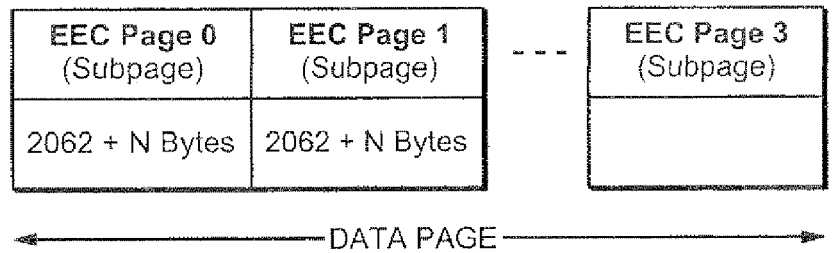
FIG. 14A illustrates a data page consisting of multiple ECC pages.

FIG. 14A illustrates a data page consisting of multiple ECC pages. For example, a data page may consist of 2, 4, or 8 ECC pages. A data page resides in a physical page 350 (see FIG. 13.) Similarly, an ECC page resides in a subpage 352.

Figure 14B:
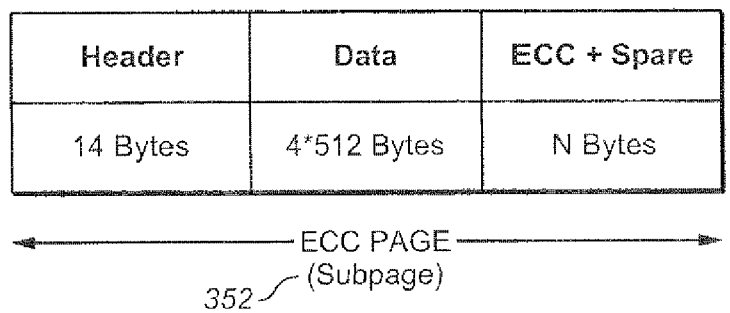
FIG. 14B illustrates an example format for an ECC page which stores only binary data and reside in a subpage.

FIG. 14B illustrates an example format for an ECC page which stores only binary data and reside in a subpage. It has three fields: a header of 14 bytes, a data section of four 512-byte sectors and a ECC plus spare portion of N bytes.

The following is a terminology for the abstraction model:
Physical NAND Layer Terms Physical Page: A maximum set of NAND memory cells which can be read or programmed concurrently in a physical block. A physical page can store one (SLC/Binary/D1) or more (MLC/D2, D3, D4)) data pages.

Data Page: A minimum amount of data which can be read and programmed concurrently in a physical block. MLC data pages differ from each other in accordance with the programming mode and order. There are Low and High pages in D2; Lower, Middle, and Upper pages in D3.

Word-line (wordline): A row of NAND memory cells across a physical block, which normally consists of one (in ABL memories) or two (called even and odd pages) physical pages.

Physical block: The minimum physical erase unit. Block consists of fixed number of physical pages and word-lines.

Plane: A subset of physical blocks within a die where the blocks are evenly distributed among planes. Parallel operations (write, read, or erase) are possible on a single block on each plane within a die.

Die: A die is a physical blocks array of one or more planes. Each die supports asynchronous operations relative to the other dies.

Chip: A chip is one or more dies, where chip-select line defines a chip.

Multi-chip package: A physical package with multiple chip select lines is referred to as multi-chip package.

Channel: A physical path to access a chip or group of chips. Channels on a card are mutually exclusive. A channel can access one or more memory banks.
Abstraction Level Terms Data Page: The Abstraction Model Data Page maps to Physical NAND Layer Data Page. The Page can be programmed up to certain number of times depending on the memory technology and reliability requirements. Typically, Data Page can only be programmed once in MLC mode and 4 times in Binary or lower-page-only modes.

Sector: Sector is 512 Bytes of host data identified by Logical Group number and offset within the Logical Group.

ECC Page: The theoretically minimum read and program data unit for the memory management with an ECC Page header, all data (2048 bytes in BE5, or 4 sectors worth of data) protected by single ECC, all stored together. One Data Page can map 2, 4 or 8 ECC Pages, depending on the Data Page size.

Meta-page: The maximum read and program unit in a bank. Meta-page comprises all data pages across a metablock which can be read and programmed concurrently. Meta-page consists of one or more die-pages.

Die-Page: The maximum read and program unit in a die. Die-page is made of all data pages across a die, which can be read and programmed concurrently. Die-page consists of one or more data pages.

Mega-page: The maximum read and program unit in a multi-bank product. Mega-page is made of all data pages across mega-block which can be read and programmed concurrently. Mega-page consists of one or more meta-pages.

Meta-block: The minimum erasable unit used by the memory management system, comprises a set of physical blocks. Normally, all meta-blocks are parallel-connected meaning they can be accessed independently and concurrently. Physical blocks forming a meta-block may be located in planes within a single chip, or in planes distributed across multiple chips, accessible from the same channel. When a meta-block is a group of multiple physical blocks they must be organized according to the interleave rules for a chip, die, plane and page; each physical block of the meta-block is capable of being accessed in parallel to the other blocks in the same meta-block Bank: The array of meta-blocks independently managed by memory management system. The bank is one metablock, one meta-page wide. A flash based product can consist of one or more banks.
Logical Level Terms Logical Sector. A Logical Sector is 512 Bytes of host data identified by LBA within a logical partition. Every Logical Sector maps to an Abstraction Model sector, which is identified by Logical Group number and offset within the Logical Group.

LBA: LBA or Logical Block Address is an identifier for a logical sector in a logically contiguous partition.

Logical Group: The group of contiguous logical sectors which maps to one meta-block. Capacity of Logical Group depends on meta-block's type (D1, D2, D3, or D4). A Logical Group corresponds to a same capacity group of logical sectors, which may or may not be logically contiguous in LBA space of a partition.

Logical Mega-group: The group of contiguous logical sectors which maps to multiple meta-blocks. Capacity of Logical Mega-Group depends on meta-block's type (D1, D2, D3, or D4). A Logical Meta-Group corresponds to a same capacity group of logical sectors, which is logically contiguous in LBA space of a partition. Logical Mega-Group is made of one or more Logical Groups from different banks.

Memory Partitioned Into Main and Binary Cache Portions

According to one aspect of the invention, in a flash memory having an array of memory cells that are organized into a plurality of blocks, the cells in each block being erased together, the flash memory is partitioned into at least two portions. A first portion forms the main memory for storing mainly user data. Individual memory cells in the main memory being configured to store one or more bits of data in each cell. A second portion forms a cache for data to be written to the main memory. Individual memory cells in the binary cache being configured to store one bit of data in each cell.

The Binary Cache of the present system has the follows features and advantages: a) it increases burst write speed to the device; b) it allows data that is not aligned to pages or meta-pages to be efficiently written; c) it accumulates data for a logical group, to minimize the amount of data that must be relocated during garbage collection of a meta-block after the data has been archived to the meta-block; d) it stores data for a logical group in which frequent repeated writes occur, to avoid writing data for this logical group to the meta-block; and e) it buffers host data, to allow garbage collection of the meta-block to be distributed amongst multiple host busy periods.

Prior art has disclosed flash memory system operating with a cache and operating in mixed MLC and SLC modes and with the SLC memory operating as a dedicated cache. However, except for features a) and possibly d), the other features of the present invention are not found in prior art. The following publications are examples of these prior art.

Using RAM in a write cache has been disclosed in U.S. Pat. No. 5,930,167 to Lee et al.

Partitioning the memory into two portions one operating in binary and the other in MLC has been disclosed in U.S. Pat. No. 6,456,528 to Chen, the entire disclosure of which is incorporated therein by reference.

United States Patent Publication Number: Publication Number: US-2007-0061502-A1 on Mar. 15, 2007 and US-2007-0283081-A1 dated Dec. 6, 2007 by Lasser both disclose a flash memory operating in mixed MLC and SLC modes. A specific portion of the memory is always allocated to operate in SLC mode and to serve as a dedicated cache.

Figure 15:
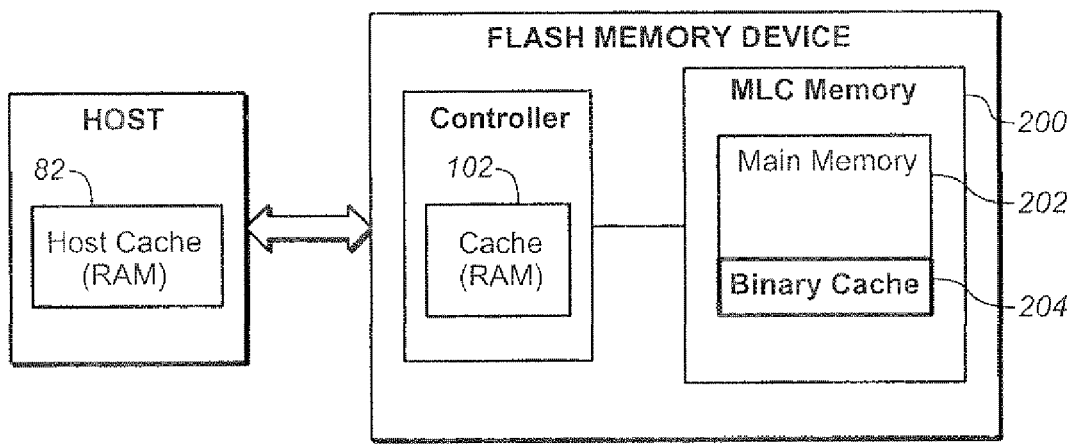
FIG. 15 illustrates a host operating with the flash memory device through a series of caches at different levels of the system.

FIG. 15 illustrates a host operating with the flash memory device through a series of caches at different levels of the system. A Cache is high-speed storage for temporarily storing data being passed between a high-speed and a slower-speed component of the system. Typically high-speed volatile RAM are employed as cache as in a host cache 82 and/or in a controller cache 102 of the memory controller. The non-volatile memory 200 is partitioned into two portions. The first portion 202 has the memory cells operating as a main memory for user data in either MLC or binary mode. The second portion 204 has the memory cells operating as a cache in a binary mode. Thus, the memory 200 is partitioned into a main memory 202 and a binary cache.

Figure 16:
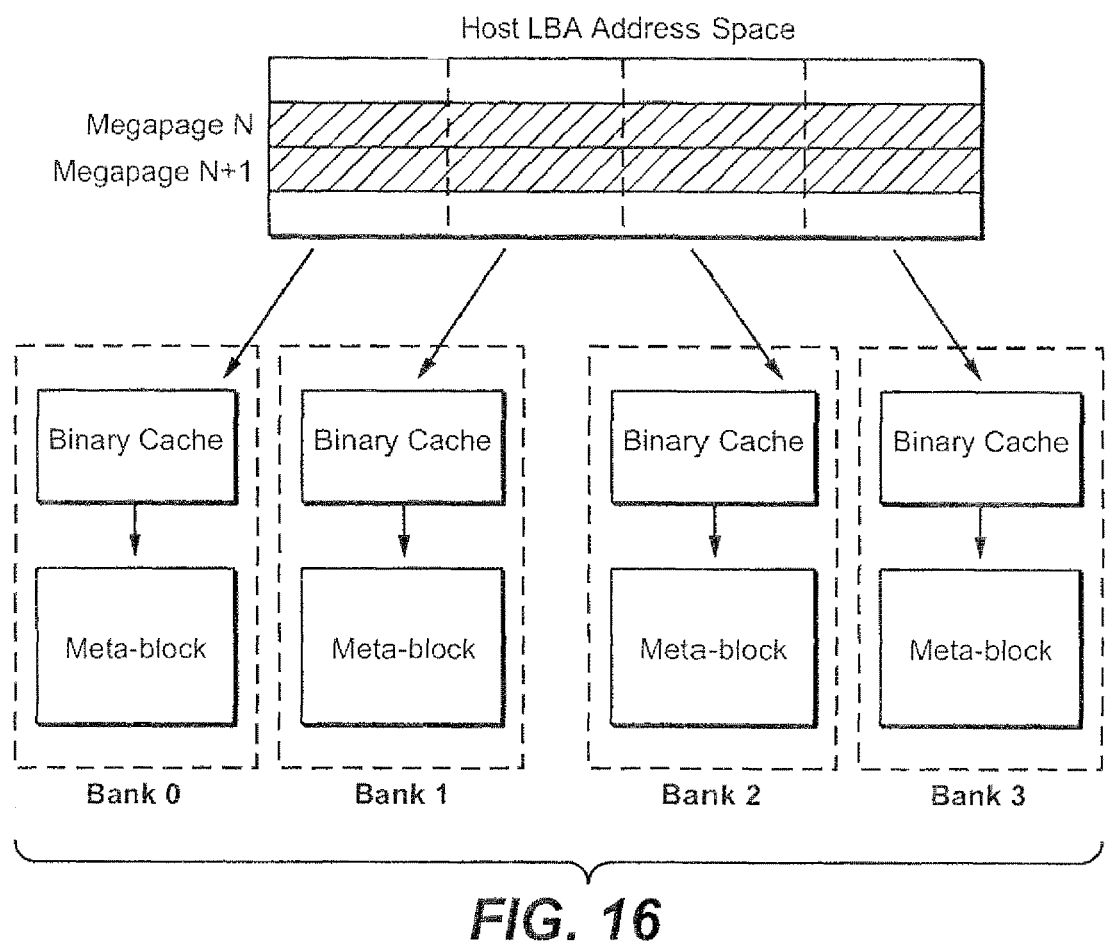
FIG. 16 illustrates the metablocks in each bank being partitioned into a binary cache portion and a regular metablock portion.

FIG. 16 illustrates the metablocks in each bank being partitioned into a binary cache portion and a regular metablock portion. As will be described in more detail later, the binary cache portion has the memory storing binary data, whereas the regular metablock portion is configured as MLC memory that can store one or more bits of data per cell. FIG. 16 also illustrates the mapping of addresses in host LBA address space to banks in a 4-bank memory. Meta-pages N and N+1 interleave across 4 banks, completely independent from each other. As described above, the memory arrays in each bank are organized into metablocks to which logical groups are mapped.

The host LBA address space comprises sequential LBA addresses within mega-pages, where a mega-page is the unit of programming parallelism, with size determined by required write speed to MLC flash.

The LBA address space for a single bank comprises sequential LBA addresses within meta-pages, and sequential meta-pages within meta-blocks. For a 4-bank memory, every 4th meta-page in host LBA address space is a meta-page in the sequential LBA address space for one bank, making bank logical space 4 times smaller. An LBA address for a bank comprises a host LBA address with two relevant bits omitted.

Media Management Layer

The Media Management Layer (MML) 330 (see also FIG. 9) is a module of the Back-End system 320 for managing the organization of logical data storage within a flash memory meta-block structure which it creates and maintains. Specific features include handling of partial meta-page programming, handling of non-sequential and repetitive updates, tables and lists used for logical-to-physical address translation and free block management, and wear leveling based on hot counts.

Figure 17:
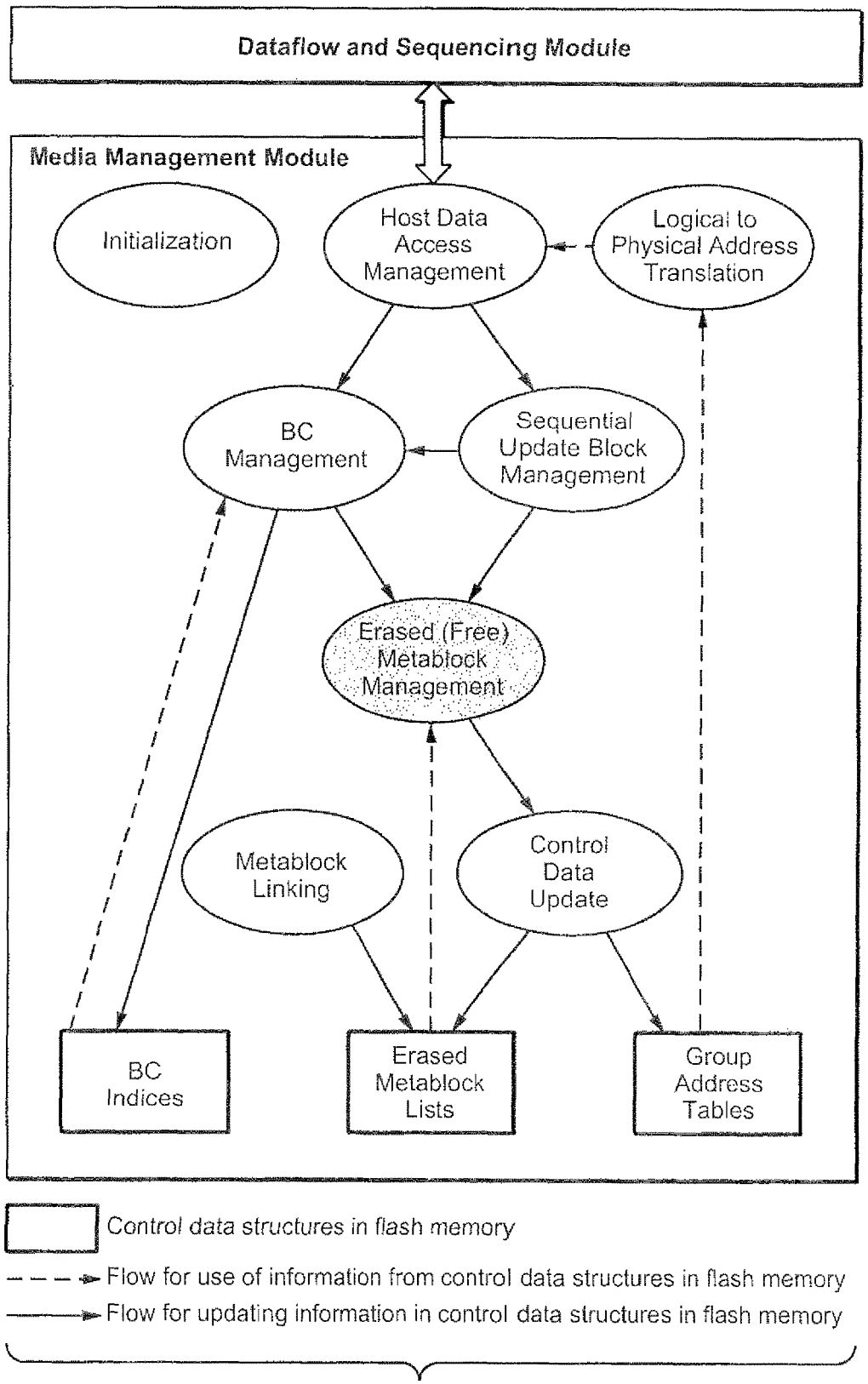
FIG. 17 illustrates processes within the Media Management Module.

FIG. 17 illustrates processes within the Media Management Module. After initialization, a host data access management is responsible for managing data exchange with the dataflow and sequencing module 340 (see also FIG. 9). When host data is received, it sends the host data either directly to the regular MLC portion or in transit to the binary cache ("BC") portion of the memory. If routed to the regular MLC portion, the data will be managed by a sequential update block management module. The sequential update block management module will have the data written page by page sequentially to one of a cluster of update blocks or to a newly allocated update block. If routed to the binary cache ("BC") portion, the data will be managed by a BC management module. The BC management module will have the data in units of ECC pages written into one or more subpages. In either cases, new block may need to be allocated or obsolete blocks recycled in cooperation with an erase (free) metablock management module. A set of control data is generated and maintained during the various block manipulations and data storage into the blocks. The control data includes BC indices, erased metablock lists, group address table ("GAT"). The control data are managed by the modules described earlier as well as a control data update module and a metablock linking module. The translation between logical to physical addresses is handled by a logical to physical address translation module operating with the group address table.

Host Data Storage

Figure 18:
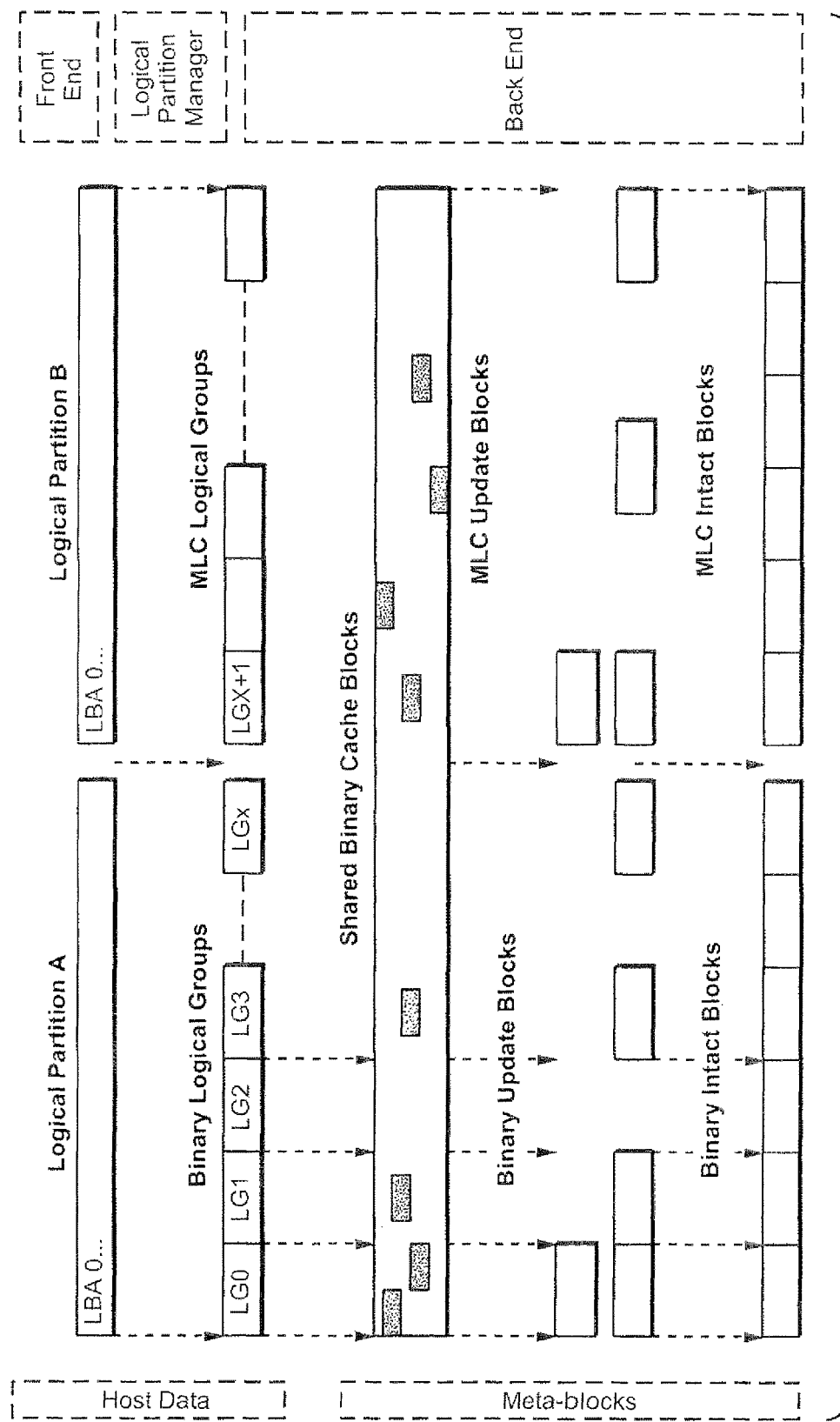
FIG. 18 illustrates the mapping of host logical data to the memory physical memory.

FIG. 18 illustrates the mapping of host logical data to the memory physical memory All LBAs in all partitions are mapped to Logical Groups—Binary, or MLC, where MLC Logical Groups can be designated as stored in full MLC mode (D2 or D3) or lower-page only mode.

Every Logical Group is mapped to an Intact block. Those Logical Groups which were updated non-sequentially can have some data stored in one ore more Update Blocks. Also, Binary Cache blocks can contain fragments for Logical Groups, regardless if they have Update Blocks or not.

Host Write to Cache or Main Memory

Figure 19:
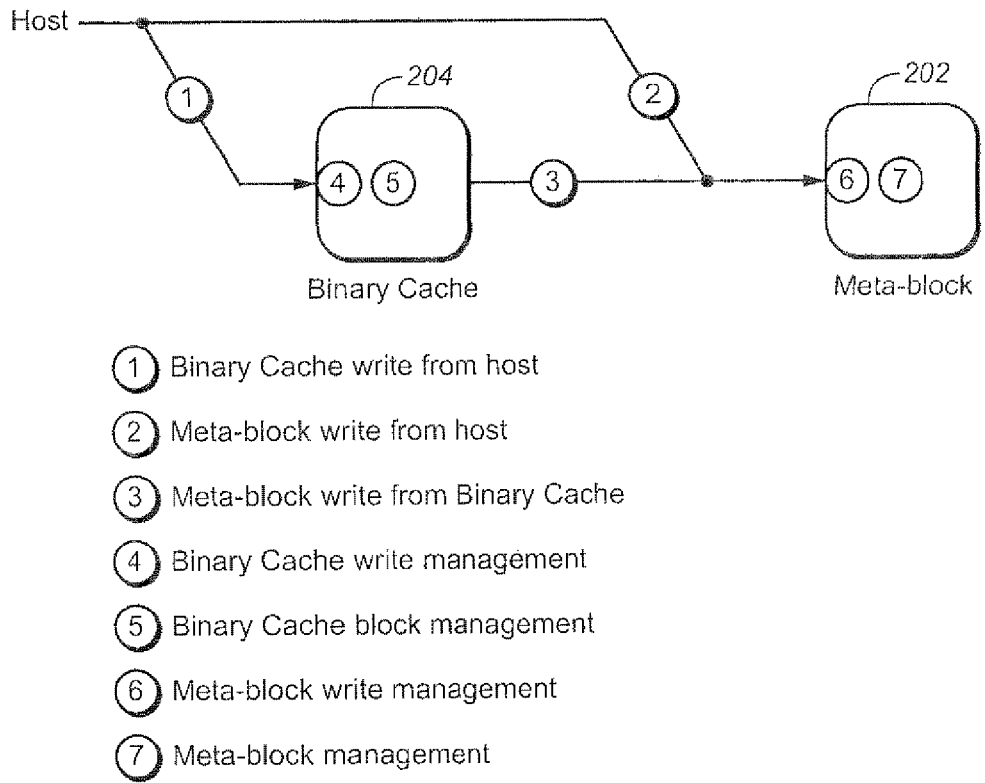
FIG. 19 illustrates the possible data paths and processes from the host to the metablock of the main memory via the binary cache.

FIG. 19 illustrates the possible data paths and processes from the host to the metablock of the main memory via the binary cache. The host data is slated for the metablocks in the main memory 202. The depending on conditions, the data is either written directly to the main memory 202 or in directly via the binary cache 204. The following is a list of the processes and management modules for the various routing shown in the figure.

(1) Binary Cache write from host
(2) Meta-block write from host
(3) Meta-block write from Binary Cache
(4) Binary Cache write management
(5) Binary Cache block management
(6) Meta-block write management
(7) Meta-block management These techniques are described more fully in United States patent applications: "NONVOLATILE MEMORY AND METHOD WITH WRITE CACHE PARTITIONING", by Paley, Alexander et al.; "NONVOLATILE MEMORY WITH WRITE CACHE HAVING FLUSH/EVICTION METHODS", by Paley, Alexander et al.; and "NONVOLATILE MEMORY WITH WRITE CACHE PARTITION MANAGEMENT METHODS", by Paley, Alexander et al.; and Provisional application "NONVOLATILE MEMORY AND METHOD WITH IMPROVED BLOCK MANAGEMENT SYSTEM", by Gorobets, Sergey A. et al., all being filed concurrently herewith.

Spare Block Pool Management

Non-volatile memory system often have defective storage elements, both from the manufacturing process and acquired or grown defects. For example, the responsiveness of flash memory cells typically changes over time as a function of the number of times the cells are erased and re-programmed. This is thought to be the result of small amounts of charge being trapped in a storage element dielectric layer during each erase and/or re-programming operation, which accumulates over time. This generally results in the memory cells becoming less reliable, and may require higher voltages for erasing and programming as the memory cells age. The effective threshold voltage window over which the memory states may be programmed can also decrease as a result of the charge retention. This is described, for example, in U.S. Pat. No. 5,268, 870. The result is a limited effective lifetime of the memory cells; that is, memory cell eventual fail to operate properly, usually failing to program or erase properly. The number of cycles to which a flash memory block is desirably subjected depends upon the particular structure of the memory cells, the amount of the threshold window that is used for the storage states, the extent of the threshold window usually increasing as the number of storage states of each cell is increased. Depending upon these and other factors, the number of lifetime cycles can be as low as 10,000 and as high as 100,000 or even several hundred thousand. To account for this, memory devices frequently employ defect management procedure and remap defective elements at the cell, sectors, block, or other structural level. Aspects of defect management are discussed in more detail in U.S. Pat. No. 5,297,148.

To account for this, memory systems will often include a number of spare or extra blocks above some predefined minimum to cover for any initial or grown defects on the device. Although more generally applicable, a number of aspects of managing such a pool of spare blocks can be described in the context of a memory systems presented in the preceding sections, which includes a binary section and a multi-level (or MLC) section. The following discussion will use the memory systems described above and in United States patent applications: "WEAR LEVELING FOR NON-VOLATILE MEMORIES: MAINTENANCE OF EXPERIENCE COUNT AND PASSIVE TECHNIQUES", by Gorobets, Sergey A. et al.; "NONVOLATILE MEMORY AND METHOD WITH WRITE CACHE PARTITIONING", by Paley, Alexander et al.; "NONVOLATILE MEMORY WITH WRITE CACHE HAVING FLUSH/EVICTION METHODS", by Paley, Alexander et al.; "NONVOLATILE MEMORY WITH WRITE CACHE PARTITION MANAGEMENT METHODS", by Paley, Alexander et al.; and MAPPING ADDRESS TABLE MAINTENANCE IN A MEMORY DEVICE, by Gorobets, Sergey A. et al.; and Provisional application "NONVOLATILE MEMORY AND METHOD WITH IMPROVED BLOCK MANAGEMENT SYSTEM", by Gorobets, Sergey A. et al., all being filed concurrently herewith, as the exemplary embodiment, with the more general situation mentioned along the way.

In the exemplary embodiment, a spare block is a free block above the minimum required for system functionality in its normal fashion, where at least one free block is used to perform consolidations and compactions. Additionally, the minimum may include a certain number of blocks which can be used as binary cache block and update blocks, to guarantee certain level of performance. There maybe some blocks allocated to be temporary closed update blocks, so that the system does not need to update free block list (FBL) and group access table (GAT) every time a new block is fully written. When the number of free blocks reaches the minimum, the system can then either go to Read-Only mode immediately, or it is possible to use less blocks as update blocks and so on, but this will gradually affect performance. The spare blocks are extra blocks above the predefined minimum and can be described as blocks that can be used to compensate for block failures before the system becomes reduced from its fully functional and, for example, goes into an "end of life" type scenario, such as a Read-Only mode or other measured described in U.S. patent publication number US-2007-0266200-A1.

Transference of Spare Blocks Between Partitions

The preceding sections present an example of a memory system having a binary section and a multi-level (MLC) section. Other details of a binary/MLC memory arrangement are also described in U.S. Pat. No. 6,456,528. In such an arrangement, the blocks operating in the MLC mode require a higher precision programming and such blocks typically can be used for less cycles than those operating in a binary mode. The binary mode is faster and more coarse, providing higher endurance. Under the binary cache arrange, the binary blocks will tend to experience more cycles than MLC ones, the system being arranged design to do more binary writes in order to reduce number of MLC operations. For example, if binary endurance is, say, 100 higher than MLC (say a maximum number of erase cycles=100K in binary mode versus 1K erase cycles in MLC mode), the system could go as far as doing 100 more binary writes than MLC writes without making effective binary block wear rate higher than MLC wear. Consequently, it were to replace 1 MLC erase with 10 binary erases, that would provide an endurance improvement for the system. In any case, however, as well as any initially bad blocks, both the binary and MLC sections may grow defective blocks.

To allow for defective memory blocks, a memory with two different portions can include spare blocks in a number of different arrangements. For example, each partition could keep its own separate spare pool, one of extra binary blocks and one of extra MLC blocks; however, this would result in the device reaching its end of life scenario when either of the pools is fully used, regardless of the state of the other pool. Another arrangement would be a shared pool of blocks for mixed use, taken by either the binary partition or MLC partition as needed and operated in the corresponding mode. In the shared pool arrangement, the memory would reach end of life scenario when the shared pool is fully used; but the resultant endurance will not be optimal because frequent random writes will no longer be kept outside the MLC partition for blocks in the shared pool and this will cause an impact to the MLC blocks, reducing any endurance advantage.

According to the aspect presented here, the two partitions have separate spare block pools, but spare blocks can be transferred from the pool for the lower endurance MLC partition to the pool for the higher endurance binary partition. This allows for a relatively small pool to be kept for the binary partition, but should the need arise, for blocks to be transferred over form the MLC block pool. For example, there may initially be assigned very few spare binary partition blocks. This initial assignment of spare binary block could even be none, but as a practical matter, there will usually a few blocks, or even just a single spare, assigned to binary so that the transfer mechanism need not be invoked by a single failure. If any additional spare blocks are need for the binary partition, MLC spares can then be transferred as needed from the larger MLC spare pool, with any transferred blocks than being operated as appropriate for the new partition (i.e., binary). Although some embodiments could also allow transferal of spares from the spare pool of the higher endurance binary pool to the MLC spare pool, this will generally not be done as the binary cells are usually operated in a coarser, faster mode that may lead to lower endurance if subsequently operated in the more stringent MLC mode.

Thus, the block pools are separate, but the device will only go to end of life mode when both pools are used up. The MLC blocks, even when having been previously used, can still be used in binary mode, which is more coarse. Therefore, aside from maybe one or a few blocks initially assigned as binary spare blocks, the system can keep, and cycle, all spare blocks within the MLC partition, and make them new binary spares when needed. As noted, the exemplary embodiment does not use the reverse transfer, since a binary block may not be usable as a MLC block, assuming binary blocks are being worn with faster rate, since a binary block is likely to reach the maximum number of MLC erases quite early in device's life.

Figure 20:
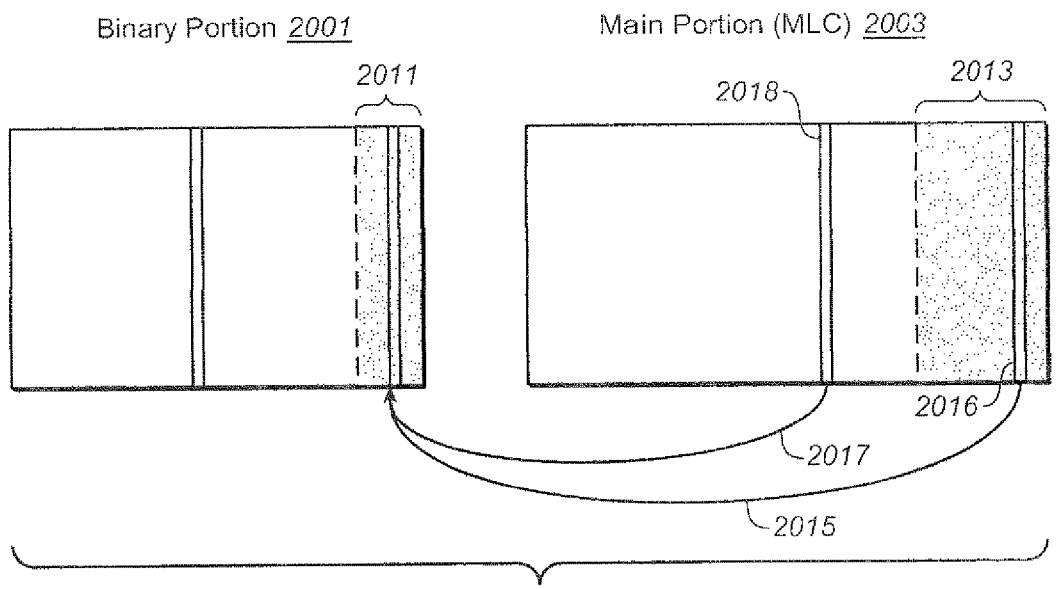
FIG. 20 illustrates the relocation of a block from a multi-level partition to the spare block section of a binary partition.

The concept can be illustrated schematically using FIG. 20. (It will be understood that the arrangement shown is just conceptual and the physical layout on a device need not group all the spare blocks together, etc.) The memory is partitioned into two sections, the binary section 2001 and MLC section 2003. The partition may be a fixed, hard partition or a dynamic or other soft partition. Each partition has spare block pool, shown as 2011 and 2013. The binary spare block pool 2011 is initially assigned few spare blocks, from none to a few, with one or two taken as the exemplary embodiment. The MLC spare block pool 2013 initially assigned a larger number of blocks. Some of these initially allotted spare may be lost at testing, being reassigned to cover for bad blocks from the production process. In any case, when the binary section 2001 needs a spare block due to, say, a programming failure, it will first check its own spare block pool 2011 and appropriate the needed block if one is available; if not, it will then request one to be reassigned as shown at 2015 from the MLC spare block pool 2013, which is then treated as the needed binary spare block. If there are no available spares in 2013 to be reassigned, the device goes into end of life mode.

It is usually preferable that the binary free block list 2011 always has at least one spare block in order to avoid "on the fly" block relocation from the MLC pool 3013 directly to a used binary block, which may create a scenario when the system has a recently erased and written binary block without prior reference in binary tables. Consequently, any time the binary pool 2011 becomes empty, the exemplary embodiment will reassign a spare binary block.

Figure 21:
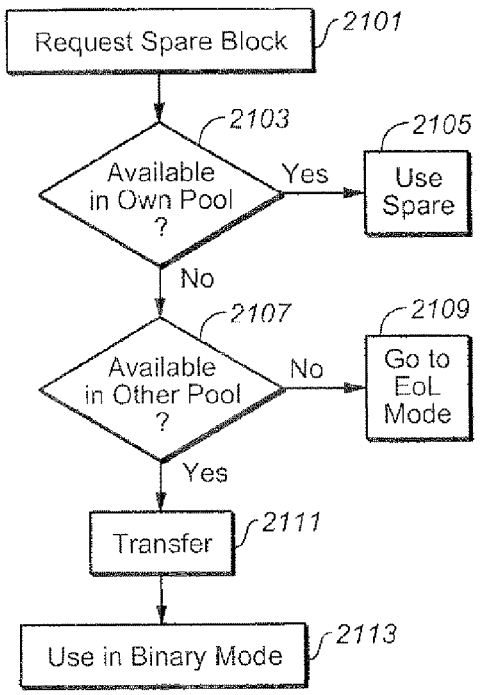
FIG. 21 is a flow for relocating a spare block from the multi-level partition to the binary partition.

FIG. 21 is flow illustrating the reassignment process for a spare block. Beginning at 2101, when the binary partition 2001 needs a spare block, it first looks in its spare block pool 2011 and, at 2103 determines whether a spare is available. If so, the spare is then used by the memory as requested; if not, at 2107, a spare block is then requested from the MLC spare block pool 2013. If the MLC pool is also empty, the device will go into end of life mode at 2109; if a spare is available, it is then transferred at 2111 (corresponding to 2015 in FIG. 20) the used in binary mode at 2113.

Although presented here in the context of a memory partitioned into a binary section and a multi-state section, it can also be used in other applications where the memory elements can be operated in more than one mode. The memory could then be similarly partitioned into two (or more) sections that are then operated according to the different modes. When the one mode is more prone to failure (as in MLC), it can be allocated a larger portion of spare blocks the division, which is operated in the other mode (as in binary) that is less prone to generating defects. When the less error prone section needs a spare block and has none available left from its relatively small allotment, a spare block is then transferred and operated accordingly. Also, although the example is based on two partitions operating in two corresponding modes, it can extended to more partitions; for example, even in the binary/MLC case, there could be more than one MLC partition operating at differing state densities. These extensions similarly apply to the following discussion related to 2017 of FIG. 20.

Considering generalizations beyond the binary-MLC example further, as noted, both partitions could both store multiple bits per cell, but of a different number, such as 2-bits per cell in the less error prone partition and 3-bits per cell in the other, or even a true binary (that is, only operated in and optimized for binary) mode and a lower-page mode of MLC. Another possibility is to have different partitions that operate with the same number of states per cell say both binary, or as in all-binary mode where the multi-level partition is operated in a lower page only mode. In this case, the memory blocks it each partition may be equally prone to errors in terms of rate per erase cycle, but the block in one partition (such as the binary cache used to store recently updated data) will be more prone to errors due to higher usage rate than blocks in the other, or main memory, partition. Consequently, it some cases the likelihood of error can be due memory operation mode and in other the usage pattern/frequency. The partitioning may also be a division of physical partition between logical partitions, say one for system data, the other for user data, where relative frequency of block erases would be determined by likely update frequency in the partitions, assuming the system data is likely to be updated more often.

Also, these techniques need not be limited to when the main spare pool be in the memory partition which is more, or less, prone to errors. More generally, the main spare pool can be in one of multiple partitions, and that allows the system to use it all before the card runs out of spares and need not be limited to a partition where error is more likely. For example, in all-binary cases, there could still be a binary cache partition of the non-volatile memory. Consequently, partitioning criteria can include: higher/lower endurance (for example, binary versus MLC); differences in density, speed, data retention (for example, lower page only versus full MLC); how prone to error (as in an all binary cases, where on partition, such as a cache area, is more frequently updated and the system could cycle spares into this partition to keep a lower average hot count and extend time failure); where one partition is higher endurance and higher update rate; and so on.

The preceding discussion has noted how MLC mode tends to be a finer, or less reliable, mode in that it has tighter operating tolerances and is usually more prone to grown defects than the more coarse binary mode. Because of this, a block that may be considered defective when operated in a multi-state mode may still be operable in binary mode: for example, although a block may experience program failure when programming an upper page, it may still be operable in a binary (e.g., lower page only) format. Consequently, a block that is found defective as an MLC block can be reassigned to the spare block pool of the binary partition. This is illustrated at 2017 in FIG. 20, where a block from the MLC partition 2003, which is outside of the MLC spare block pool 2013, is transferred over to the binary spare block pool 2011. The transfer need not be immediate, but can be performed when convenient for the system, such as a sort of background operation. If the MLC partition 2003 then needs a replacement block, this can then be shifted out of the spare pool 2013. (Again, it should be noted that the arrangement of FIG. 20, with the spare blocks all physically lumped together at one side, is just schematic.

For example, if an MLC block fails after 1K cycles, say, because it fails to meet the criteria of a finer MLC programming mode, but it may still be used in binary mode for, say, 100K cycles because the programming is more coarse and less sensitive to block wear. This is the case when the block fails to program in MLC mode due to block wear when some cells fail to program to the right levels, but not due to a severe failure, like a word-line short or substrate short. In some embodiments, the transferred block can be checked to determine that it will operate properly in binary mode. In may be preferable to more simply just transfer the block and initially assume that it will operate well in binary, since the system is in any designed to handle errors as they arise. Further, even without testing, an important indicator of whether the block will be usable in binary form is the symptoms of a failure. For example, the controller can assume that if a failure happens on the upper page (finer mode than lower page), it is due to block wear not short. There are many ways for the system to check what happened, such as an analysis of the number of unprogrammed bits.

Use of 1-Bit Time Stamp for Spare and Free Block Management

As noted above, a spare block is a free block above the minimum required for system functionality in its normal fashion. The exemplary embodiments, as described in United States patent applications: "WEAR LEVELING FOR NON-VOLATILE MEMORIES: MAINTENANCE OF EXPERIENCE COUNT AND PASSIVE TECHNIQUES", by Gorobets, Sergey A. et al.; "NONVOLATILE MEMORY AND METHOD WITH WRITE CACHE PARTITIONING", by Paley, Alexander et al.; "NONVOLATILE MEMORY WITH WRITE CACHE HAVING FLUSH/EVICTION METHODS", by Paley, Alexander et al.; "NONVOLATILE MEMORY WITH WRITE CACHE PARTITION MANAGEMENT METHODS", by Paley, Alexander et al.; and MAPPING ADDRESS TABLE MAINTENANCE IN A MEMORY DEVICE, by Gorobets, Sergey A. et al.; and Provisional application "NONVOLATILE MEMORY AND METHOD WITH IMPROVED BLOCK MANAGEMENT SYSTEM", by Gorobets, Sergey A. et al., all being filed concurrently herewith, will also a number of free blocks, both as blocks currently unassigned to a logical address for host data and also for caching, updating, consolidating, and other management functions. For example, at least one free block is kept to be used to perform consolidations and compactions. There maybe some blocks allocated to be temporary closed update blocks, so that the system does not need to update free block list (FBL) and group access table (GAT) every time a new block is fully written. The spare blocks are extra blocks above a predefined minimum that includes the full complement free blocks and can be described as blocks that can be used to compensate for block failures. In some embodiments, the spare blocks can used as any other blocks, effectively make the free block pool larger by, for example, occasionally swapping members of the spare block pool with members of the free block list. In the embodiment described here, the system only knows that it has spares by keeping a count of total free blocks. Consequently, members of the spare block pool may have been used, as opposed having been kept segregated in an used state. According, to another aspect presented here, the system keeps a 1-bit time stamp or flag as a block's attribute to tell recently written blocks in the case when blocks are not kept in erased state.

Rather than erase a block with obsolete content as soon as convenient, it may be preferable to instead erase obsolete blocks as late as possible, just before they are to be programmed. This can help to remove disturb effect a block can accumulate from being kept in an erased state for a long time. This arrangement can, however, lead to complications during initialization. When the free or spare blocks are kept in an erased state, the spare block pool and free block list would have only erased blocks, so that during initialization the system would only need to scan blocks from these to find recently written blocks. By instead not keeping blocks in an erased state, it is not enough just to perform such as scan as obsolete, free blocks and recently written blocks, with new data, may look identical. For example, consider the situation where the host may keep rewriting the same Logical Group again and again: The memory system could not tell if a block in the free block list or spare block pool has old data or just been rewritten with a new data. A 1-bit time stamp that is toggled when the system erases and starts programming the blocks is introduced for this purpose.

The time stamp bit is toggled every time the system erases and begins to program blocks. At this point, the reference in the system's tables will have the old time stamp value, say, TS=0, but the block will have TS=1 in its headers. That will indicate that the system has erased the block and started programming it since the last update of the table. At initialization, the system can scan blocks in free block list and spare block pool, and, if time stamps in the block does not match one in the free block list, say, the system can recognize the block as recently written, after the last update.

The system can maintain the time stamp as an attribute, much as is described in United States patent application "WEAR LEVELING FOR NON-VOLATILE MEMORIES: MAINTENANCE OF EXPERIENCE COUNT AND PASSIVE TECHNIQUES", by Gorobets, Sergey A. et al. being filed concurrently herewith for a block's experience or hot count, where it is maintained along with the address. Under this arrangement, the system will only store it for spare blocks, free blocks, or both. Further, under this arrangement, the system does not need to have it stored for all free/spare block, but only for those free/spare blocks which are likely to be used before the next update of the free block list as kept in non-volatile memory. For the other free blocks, the value of the 1-bit time stamp can be determined by reading it from the blocks themselves, as it will not have changed since the last update. Additionally, all blocks will have the time stamp bit stored somewhere on the block itself, such as in a page header, to allow comparison between the two values. If an MLC block is moved to the binary partition, as described above with respect to FIGS. 20 and 21, the corresponding reference can be mover from the MLC list or pool to the binary list or pool, without changing the time stamp.

As noted above, a time stamp to determine whether a spare block has been written would only be of use in embodiments where a spare block may have been previously written and not kept segregated from the other blocks until used as a replacement. For example, in the memory management of the exemplary embodiments, the system may occasionally exchange blocks between the free block list and spare block pool for wear leveling reasons, for example.

Considering the wear leveling example in more detail, as described more below and in United States Provisional application "NONVOLATILE MEMORY AND METHOD WITH IMPROVED BLOCK MANAGEMENT SYSTEM", by Gorobets, Sergey A. et al., filed concurrently herewith, the spare blocks may be kept as entries a portion of the group access table, or GAT, that extends the GAT beyond the usual logical to physical mapping and which is only for block allocation and in used as an exported logical space. The system may exchange hot (heavily used) blocks in the free block list with cold (little used) blocks from the GAT or the spare block portion of the GAT. Records can be kept of the mean hot counts of these free block list, the GAT, and the spare block portion of the GAT. These can be used to determine when to perform an exchange, and whether to exchange free blocks with spare blocks or to perform a block copy of seldom written data from a cold GAT block into a hot free block, freeing up the cold block for use. The criteria used to determine when to perform such an exchange could include: the average hot count of the blocks in the free block list is greater than a predefined amount above the average hot count of the GAT or the spare block GAT; or a predefined number of erases have been performed.

If a criteria such as these are met and the average hot count of the spare GAT is less than the average hot count of the GAT, the wear leveling code on the system will schedule a spare GAT exchange operation. (In other systems without the spare GAT arrangement, the appropriate spare block management tables or data would be used.) The wear leveling operation can then be performed at a convenient time. To find the spare blocks that are suitable to be exchanged with the free block list, a check can be made on the hot count assigned to spare blocks, whether maintained in the blocks' header, as an attribute, or in a dedicated table. Spare blocks with the lowest hot count will be used for exchange.

A procedure for exchanging free and spare blocks when the mean hot count for the free block list exceeds that of the spare GAT can be as follows: Determine how many blocks should be moved out of the free block list (for example, all free blocks having a hot count above a threshold). The same number of coldest spare blocks is found by checking their hot counts. The exchange is then made and the corresponding mean hot counts are updated. Consequently, whether by this or other exchange mechanisms, there may be spare blocks which have previously been written. More discussion of wear leveling relevant to the present discussion is given in United States patent application "WEAR LEVELING FOR NON-VOLATILE MEMORIES: MAINTENANCE OF EXPERIENCE COUNT AND PASSIVE TECHNIQUES", by Gorobets, Sergey A. et al. filed concurrently herewith.

Figure 22:
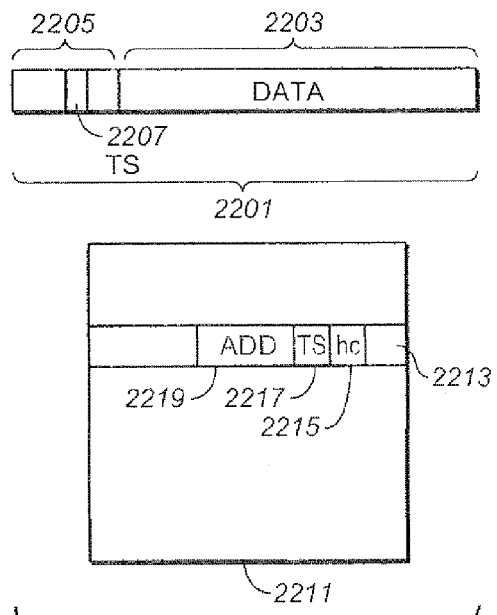
FIG. 22 illustrates the use and storage of a 1-bit time stamp for spare blocks.

Returning the discussion of the time stamp, FIG. 22 schematically illustrates the use of the time stamp. An exemplary block 2201 is shown as having a data storing portion 2203 and a header portion 2205, which includes the 1-bit time stamp TS 2207. If the blocks are organized into fixed meta-blocks, only a single TS needs to keep for the meta-block. To the right side of FIG. 22 is a data management structure 2211, such as a free block list or spare block pool, that will have the entry for the free or spare block 2201. Block 2201 has its entry in 2211 represented at 2213. In this representation, the entry 2213 will have the block's (or meta-block's, if blocks are stored as fixed meta-blocks) physical address and associated attributes, including 1 bit for the time stamp TS 2217 and, here, also the experience (or hot) count he 2213. More generally, the TS bit 2207 is stored somewhere on the unit of erase, whether the basic physical unit (block) or composite virtual unit (meta-block), and the corresponding TS bit 2217 is maintained by the data management system as an attribute for the corresponding unassigned (free or spare) erase structure among its management data.

The TS 2217 values in the free/spare block tables is set when the free block list is newly populated with the block, its time stamp being added along with its address. When a block which used to be referenced somewhere else, say by the GAT, becomes free, it is added to the free block list with the time stamp copied "as is" copied from its header time stamp 2207. As described above, in the exemplary embodiment, the system holds obsolete blocks in the free and spare block pools in an un-erased state until as late as practical. The TS value 2207 stored on the block itself will be toggled when the system erases the block and programs to it before the next erase. It is programmed to the first header to be programmed and may be continued in the other headers as well. On the next update of the free block list, it can be removed from the free block list as it is not longer free or spare, be is reference somewhere else, such as the group access table or updating information for the access table. Consequently, the comparison of these two TS bits 2207 and 2217 for a given block will indicate whether the block has been erased and stated to be programmed since the last update of the table. As obsolete, free blocks and recently written blocks, with new data may look identical, a comparison of the two can tell if a block in the free block list or spare pool has old data or just been rewritten with a new data. At initialization, the system scan free and/or blocks and if time stamp in block does not match one in the control structure, the block is recognized as recently written, after the last data structure update. In this way, the time stamp allows the system to use blocks from the free block list without the need to update free block list every time it is done, since the system can scan the free block list and check the time stamps to find out what changed.

As noted, in the exemplary embodiment, all free and spare blocks have un-erased, obsolete data (once they have been programmed the first time. The time stamp allows for the determination of whether a block has been used since the last date that free or spare block list has been updated, since this cannot be determined just by looking as a block's data. In some arrangements, a global, absolute time could be kept in both the blocks themselves as well as a free block listing, which could be used to tell whether a block has a newer global time stamp than that in the free block list. However, such an absolute time stamp would take more space (likely on the order of 32 bits) to store, as opposed to the 1-bit time stamp presented here that only needs the single bit to tell whether the block has or has not be used since the last update.

Maintenance of Spare Blocks in Access Table

As noted above, in another aspect presented here, spare blocks, free blocks, or both, can be addressed by the group access table. Traditionally, an access table, such as a File Access Table (FAT) or the group access table (GAT) mainly described here, is a look up table with an entry for each logical address, where the addresses are at the appropriate level of granularity for the system: file, sector, block, or, in the exemplary GAT, meta-block. Each GAT entry stores the corresponding physical location for the currently stored logical address. Depending on the embodiment, various attributes of the address may also be stored associated with the address, such as the just described 1-bit time stamp or the experience count of United States patent application "WEAR LEVELING FOR NON-VOLATILE MEMORIES: MAINTENANCE OF EXPERIENCE COUNT AND PASSIVE TECHNIQUES", by Gorobets, Sergey A. et al. filed concurrently herewith. The aspect presented here extends the access table to include entries not associated with a host's logical address: If the memory has too many spare blocks to fit into the free block list, the system creates additional GAT entries to be used as placeholders for the excess spare blocks. Schematically, this is equivalent to formatting a device to a larger logical capacity without making the extra capacity available to the host and the blocks, pre-allocated for the extra logical capacity will be used as spares, since the host will not use them.

Although more generally applicable to systems using address translation tables, the discussion here will be based on the exemplary embodiments of United States patent applications: "WEAR LEVELING FOR NON-VOLATILE MEMORIES: MAINTENANCE OF EXPERIENCE COUNT AND PASSIVE TECHNIQUES", by Gorobets, Sergey A. et al.; "NONVOLATILE MEMORY AND METHOD WITH WRITE CACHE PARTITIONING", by Paley, Alexander et al.; "NONVOLATILE MEMORY WITH WRITE CACHE HAVING FLUSH/EVICTION METHODS", by Paley, Alexander et al.; "NONVOLATILE MEMORY WITH WRITE CACHE PARTITION MANAGEMENT METHODS", by Paley, Alexander et al.; and MAPPING ADDRESS TABLE MAINTENANCE IN A MEMORY DEVICE, by Gorobets, Sergey A. et al.; and Provisional application "NONVOLATILE MEMORY AND METHOD WITH IMPROVED BLOCK MANAGEMENT SYSTEM", by Gorobets, Sergey A. et al., all being filed concurrently herewith. The group access table (GAT) is a look up table with an entry for each logical group, both the logical addresses for the host data and the extended logical address space for blocks not associated with the host's logical addresses. Each GAT entry stores the meta-block (physical) address for an entry, and, according to the embodiment, associated attributes which can include hot count, 1-bit time stamp, and so on. The GAT is stored in the nonvolatile memory in control blocks in GAT pages holding entries for a contiguous set of logical groups. Portions of the GAT can then be cached in the controller's SRAM memory to reduce the number of reads on the non-volatile memory. There is one entry in the GAT for each logical group, both the host associated logical addresses and the extended logical space for spare blocks. This extended portion for spare blocks can be referred to as Spare GAT or SGAT.

The memory management layer will handle the various tasks related to the GAT, included the extended SGAT portion. For the non-extend portion of the GAT, this would include the various control and mapping operations, such as the control and management of the GAT pages on the non-volatile memory and the various caching mechanisms related to GAT use. For the SGAT, this would include managing un-allocated metablocks forming GAT entries and also to supply the free block exchange routine mentioned above. The SGAT pages can be located just after the standard GAT pages in a page list index. As discussed previously, the free block exchange routine would take the required un-allocated meta-blocks from the SGAT pages and replace them with the required free blocks. All or just a portion, such as any excess beyond some minimum, of the free blocks can be maintained in the SGAT.

Figure 23:
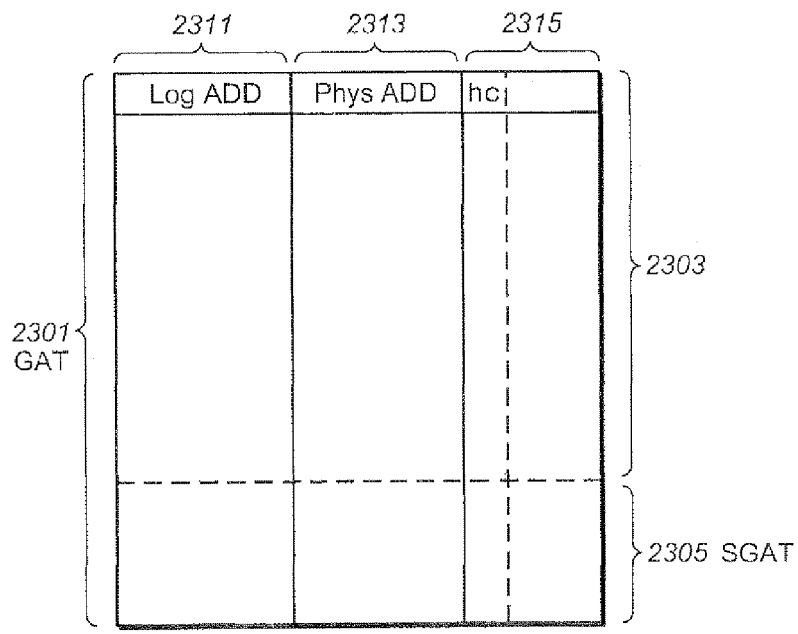
FIG. 23 is of an access table for an extended logical space.

FIG. 23 schematically illustrates the GAT structure. The GAT 2301 is here structured as the usual portion 2303 and the SGAT portion 2305. Each entry includes the logical address 2311, the associated physical address 2313, and associated attributes 2215. The entries in the portion 2303 correspond to the logical addresses from the host. The entries in the SGAT portion 2305 will be for logical addresses not exported to, and not available to, the host, with the corresponding physical address entries being those of spare blocks. The logical address space for the SGAT entries will begin with a value following that of the address range as seen by the host from outside of the memory system. As blocks are allocated or de-allocated to host data based upon (the host's) logical addresses, these will be entered in usual portion 2303 of the before the SGAT section 2305. Consequently, this arrangement provides a convenient storage mechanism for free blocks, particularly when the number of these exceed the number of allocated storage slots in the free and/or spare block lists.

Conclusion

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A non-volatile memory system, comprising:
a non-volatile memory circuit having a plurality of erase blocks each formed of a plurality of non-volatile memory cells, the blocks being operable in a first and a second mode, the first operating mode being of higher endurance than the second operating mode; and
a controller circuit connected to the memory circuit for controlling the transfer of data between the memory circuit and a host to which the memory system is attached and the management of data stored on the memory circuit, the memory being partitioned into a first section of blocks operated according to the first mode and a second section of blocks operated according to the second mode, where the second section initially includes one or more spare blocks allocated to be used to replace a defective block in the second section and where the controller can reassign spare blocks from the second section to be spare blocks for the first section.

2. The non-volatile memory system of claim 1, wherein the first mode operates the memory cells in a binary mode and the second mode operates the memory cells in a multi-level mode.

3. The non-volatile memory system of claim 1, where the partition of non-spare blocks the memory into a first and section is fixed.

4. The non-volatile memory system of claim 1, where the partition of non-spare blocks the memory into a first and section is variable.

5. The non-volatile memory system of claim 1, where the first section initially includes one or more spare blocks allocated to be used to replace a defective block in the first section.

6. The non-volatile memory system of claim 5, where the first section initially includes one spare block allocated to be used to replace a defective block in the first section.

7. The non-volatile memory system of claim 1, where the controller reassigns a spare block from the second section to be spare blocks for the first section in response to the first section having too few spare blocks.

8. The non-volatile memory system of claim 1, where the controller does not reassign spare blocks from the first section to be spare blocks for the second section.

9. The non-volatile memory system of claim 1, wherein the first section is used to store user data and the second section is used to store system data.

10. The non-volatile memory system of claim 1, wherein the second section is used as a cache memory for data stored in the first section.

11. A method of operating a non-volatile memory system including a non-volatile memory circuit having a plurality of erase blocks each formed of a plurality of non-volatile memory cells and a controller circuit connected to the memory circuit for controlling the transfer of data between the memory circuit and a host to which the memory system is attached and the management of data stored on the memory circuit, the method comprising:
  partitioning the memory into a first section of blocks and a second section of blocks, where the second section initially includes one or more spare blocks allocated to be used to replace a defective block in the second section;
  operating the blocks of the first section according to a first mode;
  operating the blocks of the second section according to a second mode, the first operating mode being of higher endurance than the second operating mode; and
  reassigning by the controller of a spare block from the second section to be a spare block for the first section.

12. The method of claim 11, wherein the first mode operates the memory cells in a binary mode and the second mode operates the memory cells in a multi-level mode.

13. The method of claim 11, where the partition of non-spare blocks the memory into a first and section is fixed.

14. The method of claim 11, where the partition of non-spare blocks the memory into a first and section is variable.

15. The method of claim 11, where the first section initially includes one or more spare blocks allocated to be used to replace a defective block in the first section.

16. The method of claim 15, where the first section initially includes one spare block allocated to be used to replace a defective block in the first section.

17. The method of claim 11, where the controller reassigns a spare block from the second section to be spare blocks for the first section in response to the first section having too few spare blocks.

18. The method of claim 11, where the controller does not reassign spare blocks from the first section to be spare blocks for the second section.

19. The method of claim 11, wherein the first section is used to store user data and the second section is used to store system data.

20. The method of claim 1, wherein the second section is used as a cache memory for data stored in the first section.

21. A non-volatile memory system, comprising:
  a non-volatile memory circuit having a plurality of erase blocks each formed of a plurality of non-volatile memory cells, the blocks being operable in a first and a second mode, the first operating mode being of higher endurance than the second operating mode; and
  a controller circuit connected to the memory circuit for controlling the transfer of data between the memory circuit and a host to which the memory system is attached and the management of data stored on the memory circuit, the memory being partitioned into a first section of blocks operated according to the first mode and a second section of blocks operated according to a second mode, where, in response to determining that a block from the second partition is defective when operated in the second mode, the controller can reassign the determined block to the first partition to be a spare block usable to replace a defective block in the first section and operated according to the first mode.

22. The non-volatile memory system of claim 21, wherein the first mode operates the memory cells in a binary mode and the second mode operates the memory cells in a multi-level mode.

23. The non-volatile memory system of claim 21, where the first section initially includes one or more spare blocks allocated to be used to replace a defective block in the first section.

24. The non-volatile memory system of claim 21, where, subsequent to determining that said block from the second partition is defective when operated in the second mode and prior to reassigning the determined block to the first partition to be a spare block, the controller determines whether the block determined to be defective when operated in the second mode is also defective when operated in the first mode.

25. The non-volatile memory system of claim 21, where the controller determines whether to reassign the determined block based upon the failure mode when operated in the second mode.

26. A method of operating a non-volatile memory system having
  A method of operating a non-volatile memory system including a non-volatile memory circuit having a plurality of erase blocks each formed of a plurality of non-volatile memory cells and a controller circuit connected to the memory circuit for controlling the transfer of data between the memory circuit and a host to which the memory system is attached and the management of data stored on the memory circuit, the method comprising:
  partitioning the memory into a first section of blocks and a second section of blocks;
  operating the blocks of the first section according to a first mode;
  operating the blocks of the second section according to a second mode, the first operating mode being of higher endurance than the second operating mode;
  determining that a block from the second partition is defective when operated in the second mode; and
  in response to determining that a block from the second partition is defective when operated in the second mode, reassigning by the controller the determined block to the first partition to be a spare block usable to replace a defective block in the first section and operated according to the first mode.

27. The method of claim 26, wherein the first mode operates the memory cells in a binary mode and the second mode operates the memory cells in a multi-level mode.

28. The method of claim 26, where the first section initially includes one or more spare blocks allocated to be used to replace a defective block in the first section.

29. The method of claim 26, further comprising:
  subsequent to determining that said block from the second partition is defective when operated in the second mode and prior to reassigning the determined block to the first partition to be a spare block, determining by the controller whether the block determined to be defective when operated in the second mode is also defective when operated in the first mode.

30. The method of claim 26, where the controller determines whether to reassign the determined block based upon the failure mode when operated in the second mode.

31. A non-volatile memory system, comprising:
a non-volatile memory circuit having a plurality of erase blocks each formed of a plurality of non-volatile memory cells, the memory blocks including a data storage portion and an overhead storing portion, the overhead including a one bit time stamp; and
a controller circuit connected to the memory circuit to control the transfer of data between the memory circuit and a host to which the memory system is attached and to manage data stored on the memory circuit, where the control circuit maintains a control structure for unassigned blocks that includes a one bit time stamp for each unassigned block,
where the value of the time stamp's bit in the overhead of a given block is toggled in response to the block undergoing an erase operation and the value of the time stamp in the control structure for the unassigned blocks is set to the value of time stamp in the overhead of the corresponding block when the corresponding block is entered in the control structure for unassigned blocks, and
wherein during an initialization process, the controller performs a comparison of the values of said time stamp in the overhead of the unassigned blocks with the value of the corresponding time stamp in the control structure for the respective unassigned blocks.

32. The non-volatile memory system of claim 31, wherein the control circuit maintains a copy of said control structure in the non-volatile memory circuit.

33. The non-volatile memory system of claim 32, wherein based upon the comparison, the controller determines which of the block entered in the control structure for unassigned blocks has been written since the last updating of the copy of said control structure maintained in the non-volatile memory circuit.

34. A method of operating a non-volatile memory system having a non-volatile memory circuit having a plurality of erase blocks each formed of a plurality of non-volatile memory cells, the memory blocks including a data storage portion and an overhead storing portion, and a controller circuit connected to the memory circuit to control the transfer of data between the memory circuit and a host to which the memory system is attached and to manage data stored on the memory circuit, the method comprising:
maintaining in the overhead of the blocks a one bit time stamp;
maintaining by the controller circuit a control structure for unassigned blocks that includes a one bit time stamp for each unassigned block;
toggling the value of the time stamp's bit in the overhead of a given block in response to the block undergoing an erase operation;
setting the value of the time stamp in the control structure for the unassigned blocks to the value of time stamp in the overhead of the corresponding block when the corresponding block is entered in the control structure for unassigned blocks; and
performing an initialization process, including the controller performing a comparison of the values of said time stamp in the overhead of the unassigned blocks with the value of the corresponding time stamp in the control structure for the respective unassigned blocks.

35. The method of claim 34, further comprising the control circuit maintaining a copy of said control structure in the non-volatile memory circuit.

36. The method of claim 35, further comprising, based upon the comparison, the controller determines which of the block entered in the control structure for unassigned blocks has been written since the last updating of the copy of said control structure maintained in the non-volatile memory circuit.

37. A non-volatile memory system, comprising:
a non-volatile memory circuit having a plurality of erase blocks each formed of a plurality of non-volatile memory cells; and
a controller circuit connected to the memory circuit to control the transfer of data between the memory circuit and a host to which the memory system is attached and to manage data stored on the memory circuit,
where the plurality of blocks include a first plurality of blocks used to store host supplied data identified by a logical address and to store system data and one or more spare blocks to compensate for failed blocks of the first plurality of blocks, and the control circuit maintains a logical to physical addresses conversion table holding entries for blocks containing host supplied data and entries for spare blocks,
where the table entries assign the blocks containing host supplied data the corresponding logical addresses by which the host identifies the data and assign spare blocks logical addresses exceeding the logical address space of which the host is aware.

38. The non-volatile memory system of claim 37, wherein the table entries further maintains associated attributes for the blocks.

39. The non-volatile memory system of claim 38, wherein the associated attributes for the blocks includes the blocks' respective experience count.

40. The non-volatile memory system of claim 38, wherein the associated attributes for the spare blocks includes a one bit time stamp.

41. The non-volatile memory system of claim 37, wherein the controller circuit forms memory blocks into composite multi-block structures and the table entries are for said composite multi-block structures.

42. The non-volatile memory system of claim 37, wherein the table entries for spare blocks are for less than all of the spare blocks in the memory system.

43. A method of operating a non-volatile memory system having a non-volatile memory circuit having a plurality of erase blocks each formed of a plurality of non-volatile memory cells and a controller circuit connected to the memory circuit to control the transfer of data between the memory circuit and a host to which the memory system is attached and to manage data stored on the memory circuit, the method comprising:
using a first plurality of the plurality of blocks to store host supplied data identified by a logical address and to store system data;
using one or more spare blocks to compensate for failed blocks of the first plurality of blocks; and
maintaining by the control circuit a logical to physical addresses conversion table holding entries for blocks containing host supplied data and entries for spare blocks, the maintaining a table including:
assigning the table entries for blocks containing host supplied data the corresponding logical addresses by which the host identifies the data; and
assigning the table entries for the spare blocks logical addresses exceeding the logical address space of which the host is aware.

44. The method of claim 43, wherein the table entries further maintain associated attributes for the blocks.

45. The method of claim 43, wherein the associated attributes for the blocks includes the blocks' respective experience count.

46. The method of claim 43, wherein the associated attributes for the spare blocks includes a one bit time stamp.

47. The method of claim 43, wherein the controller circuit forms memory blocks into composite multi-block structures and the table entries are for said composite multi-block structures.

48. The method of claim 43, wherein the table entries for spare blocks are for less than all of the spare blocks in the memory system.

* * * * *

UNITED STATES PATENT AND TRADEMARK OFFICE
CERTIFICATE OF CORRECTION

PATENT NO.      : 8,040,744 B2                                Page 1 of 1
APPLICATION NO. : 12/348825
DATED           : October 18, 2011
INVENTOR(S)     : Gorobets et al.

It is certified that error appears in the above-identified patent and that said Letters Patent is hereby corrected as shown below:

Column 29, line 56, in claim 20, please delete "claim 1," and insert --claim 11--.

Signed and Sealed this
Thirteenth Day of March, 2012

David J. Kappos
*Director of the United States Patent and Trademark Office*